(12) United States Patent
Yamaguchi et al.

(10) Patent No.: US 8,564,761 B2
(45) Date of Patent: Oct. 22, 2013

(54) SURFACE SHAPE MEASURING APPARATUS, EXPOSURE APPARATUS, AND DEVICE MANUFACTURING METHOD

(75) Inventors: Wataru Yamaguchi, Utsunomiya (JP); Takahiro Matsumoto, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 930 days.

(21) Appl. No.: 12/393,767

(22) Filed: Feb. 26, 2009

(65) Prior Publication Data
US 2009/0219499 A1    Sep. 3, 2009

(30) Foreign Application Priority Data

Feb. 28, 2008   (JP) .................................. 2008-048176

(51) Int. Cl.
*G03B 27/72* (2006.01)
(52) U.S. Cl.
USPC ........................................................... 355/71
(58) Field of Classification Search
USPC .................................. 355/67, 71, 53; 356/495
See application file for complete search history.

(56) References Cited

U.S. PATENT DOCUMENTS

| | | | |
|---|---|---|---|
| 4,864,123 A * | 9/1989 | Mizutani et al. | 250/225 |
| 6,249,351 B1 | 6/2001 | De Groot | |
| 6,433,872 B1 | 8/2002 | Nishi et al. | |
| 6,806,966 B1 * | 10/2004 | Mueller et al. | 356/514 |
| 7,684,050 B2 * | 3/2010 | Matsumoto et al. | 356/514 |
| 7,751,059 B2 * | 7/2010 | Van Asten et al. | 356/500 |
| 2001/0013935 A1 * | 8/2001 | Watanabe et al. | 356/600 |
| 2004/0000627 A1 * | 1/2004 | Schuster | 250/201.2 |
| 2004/0165161 A1 * | 8/2004 | Hara | 355/30 |
| 2005/0044963 A1 | 3/2005 | Lyons | |
| 2005/0057757 A1 * | 3/2005 | Colonna De Lega et al. | 356/497 |
| 2009/0225327 A1 * | 9/2009 | Maeda | 356/496 |

FOREIGN PATENT DOCUMENTS

| | | |
|---|---|---|
| JP | 6-260391 A | 9/1994 |
| JP | 7-231023 A | 8/1995 |
| JP | 2006-514744 A | 5/2006 |

* cited by examiner

*Primary Examiner* — Peter B Kim
*Assistant Examiner* — Deoram Persaud
(74) *Attorney, Agent, or Firm* — Canon U.S.A., Inc., IP Division

(57) ABSTRACT

A surface shape measuring apparatus includes an illumination system and a light receiving system. The illumination system splits wide-band light from a light source into measurement light and reference light, illuminates the measurement light to obliquely enter a surface of the film, and illuminates the reference light to obliquely enter a reference mirror. The light receiving system combines the measurement light reflected by the surface of the film and the reference light reflected by the reference mirror with each other and introduces the combined light to a photoelectric conversion element. An incident angle of the measurement light upon the surface of the film and an incident angle of the reference light upon the reference mirror are each larger than the Brewster's angle. S-polarized light and p-polarized light included in the measurement light entering a surface of the substrate have equal intensity on the photoelectric conversion element.

9 Claims, 20 Drawing Sheets

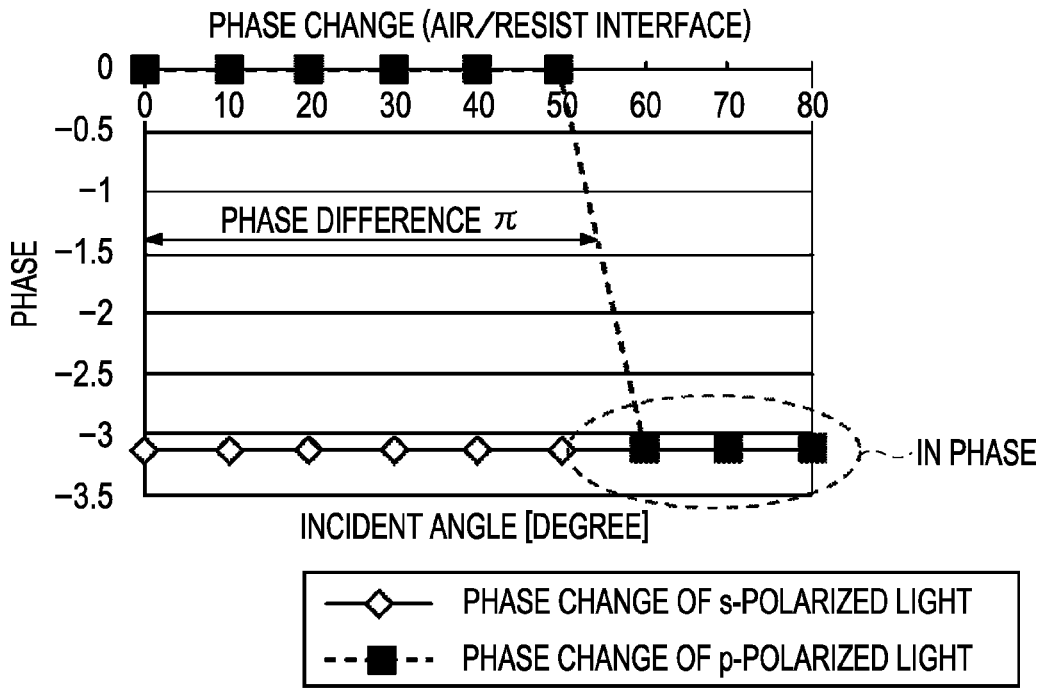
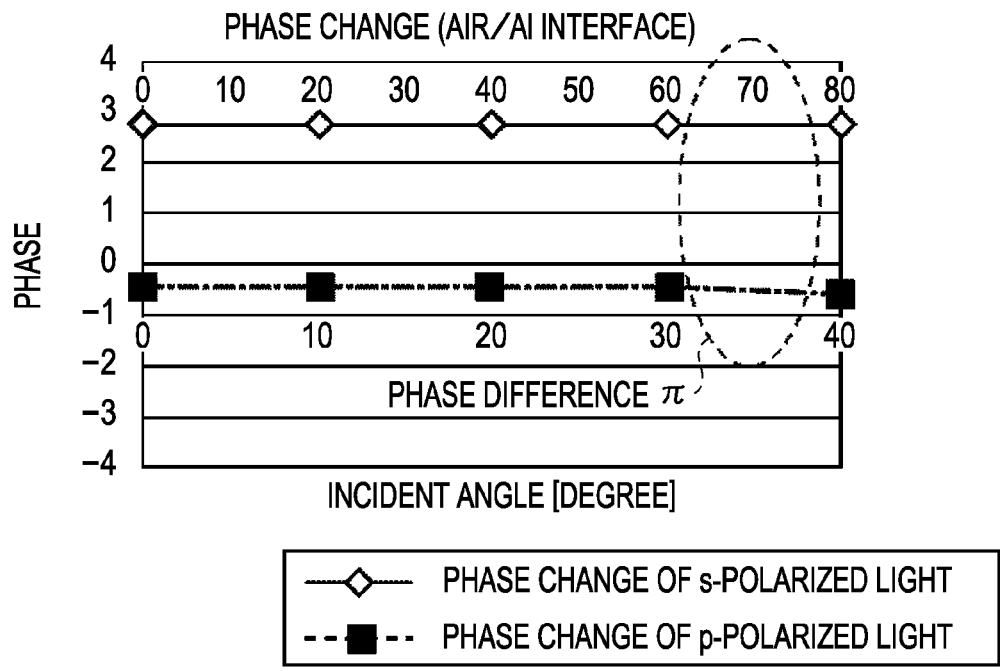

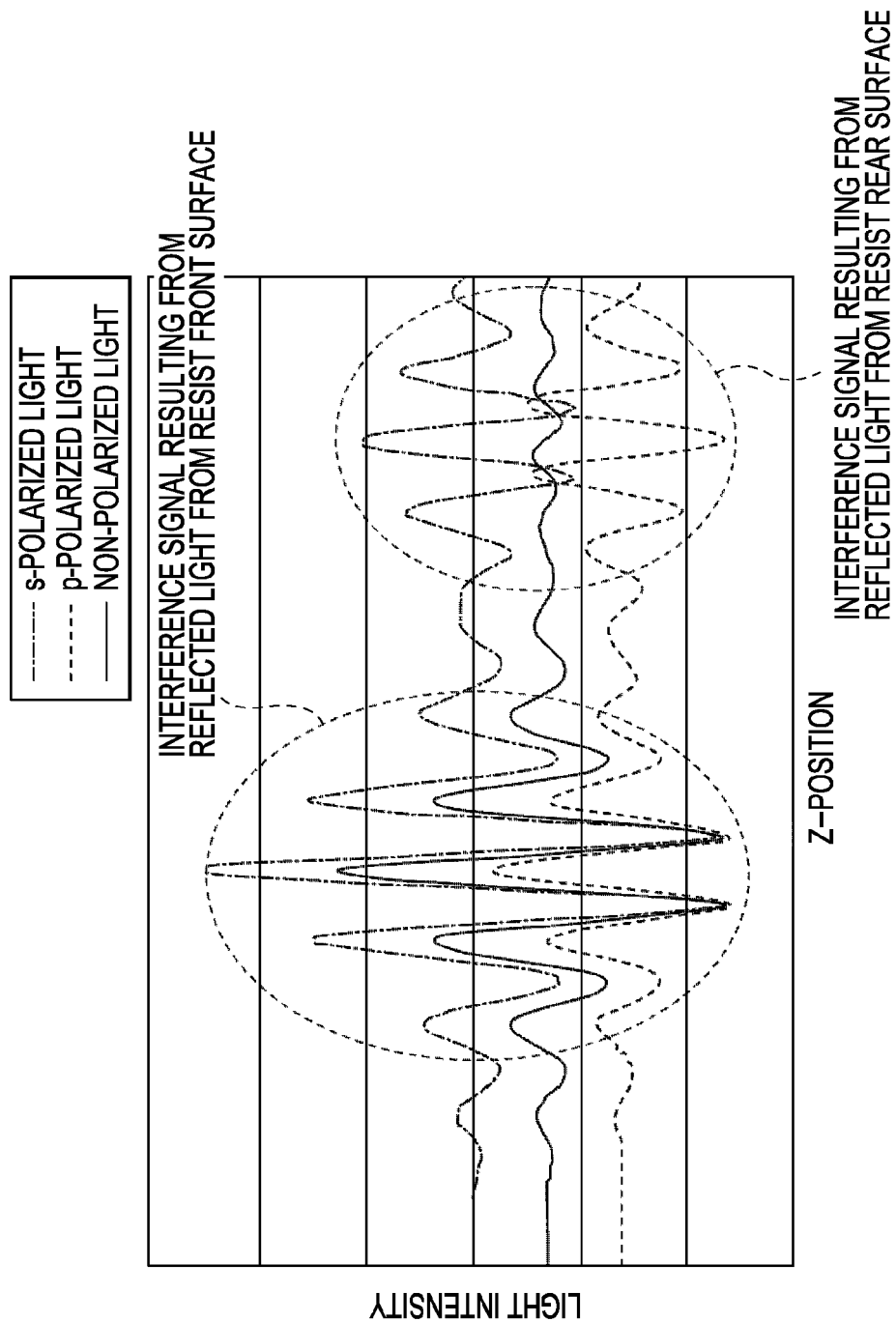

SURFACE SHAPE MEASURING APPARATUS, EXPOSURE APPARATUS, AND DEVICE MANUFACTURING METHOD

BACKGROUND OF THE INVENTION

1. Field of the Invention

The present invention relates to surface shape measuring apparatuses and exposure apparatuses.

2. Description of the Related Art

The related art regarding a surface shape measuring apparatus and an exposure apparatus employing the former is described in connection with a semiconductor exposure apparatus which needs high accuracy in surface shape measurement.

When a microstructural semiconductor device or liquid crystal display device, such as a semiconductor memory or a logical circuit, is manufactured by using photolithography (printing) techniques, a projection exposure apparatus is used to project and transfer a circuit pattern, which is drawn on a reticle (mask), onto a wafer, etc. through a projection optical system.

In the projection exposure apparatus, a higher packing density of a semiconductor device causes a demand for projecting the circuit pattern on the reticle to the wafer for exposure with higher resolving power. A minimum critical dimension (resolution) transferrable in the projection exposure apparatus is proportional to the wavelength of light used in the exposure and is inversely proportional to the numerical aperture (NA) of the projection optical apparatus. Accordingly, as the exposure wavelength is set to a shorter value, higher resolving power is obtained. For that reason, a light source used in the projection exposure apparatus has recently been changed from an ultrahigh pressure mercury lamp (i.e., the g line (wavelength of about 436 nm) or the i line (wavelength of about 365 nm)) to a KrF excimer laser (wavelength of about 248 nm) or an ArF excimer laser (wavelength of about 193 nm), which emits light with a shorter wavelength. Practical use of immersion exposure is also studied. In addition, an even wider exposure region is demanded.

To meet those demands, a dominating exposure apparatus is changed from a step-and-repeat type (also called "stepper") in which a substantially square exposure region is printed on a wafer at a reduction scale by one-shot exposure, to a step-and-scan type (also called "scanner") in which an exposure region has a rectangular slit shape and a larger target area can be exposed with higher accuracy by relatively scanning a reticle and a wafer at a high speed.

In the scanner, during the exposure, before a predetermined position on the wafer reaches an exposure slit region, a wafer surface position (i.e., a position in the direction of an optical axis of a projection optical system, also called a focus) at the predetermined wafer position is measured by a surface position detecting unit in the form of a light oblique-incidence system. In accordance with a measurement result, correction is performed such that the wafer surface is aligned with the best focus position for the exposure when the predetermined wafer position is exposed.

In particular, a plurality of measurement points are set in the exposure slit region in the lengthwise direction (direction perpendicular to the scanning direction) of the exposure slit to measure not only the height (focus) of the wafer surface position, but also the tilt of the wafer surface. Many methods have been proposed to measure the focus and the tilt. As methods of measuring the wafer surface position, for example, Japanese Patent Laid-Open No. 06-260391 and U.S. Pat. No. 6,249,351 propose the use of an optical sensor. PCT Application Domestic Laid-Open No. 2006-514744 proposes the use of a gas gauge sensor configured to spray air to a wafer and to measure a wafer surface position. Another method of using an electrostatic capacitance sensor is also proposed.

Recently, however, with a tendency toward a shorter wavelength of the exposure light and a larger NA of the projection optical system, the focal depth has become very small, and accuracy demanded in aligning the wafer surface to be exposed with the best focus plane, i.e., the so-called focus accuracy, has been increased to an even higher level. In particular, measurement errors of the surface position detecting unit have become non-negligible even when the measurement errors are caused by an influence of a pattern on the wafer and a variation in thickness of a resist coated on the wafer.

Due to a variation in thickness of the resist, for example, a step-like level difference is generated near peripheral circuit patterns and scribe lines, though small in comparison with the focal depth, to such an extent as being significant to the focus measurement. Therefore, a tilt angle of the resist surface is increased, and among reflected lights detected by the surface position detecting unit, the reflected light from a rear surface of the resist is shifted from a specular reflection angle after being reflected or refracted. Further, due to a difference in density of patterns on the wafer, reflectance differs between a region where the patterns are dense and a region where the patterns are coarse. Thus, among the reflected lights detected by the surface position detecting unit, the reflected light from the rear surface of the resist is changed in reflection angle and reflection intensity, and a waveform obtained by detecting such reflected light becomes asymmetric and measurement errors are generated.

FIG. 19 illustrates a case where measurement light MM is illuminated to a substrate SB, which has reflectance differing in different regions, in an optical sensor proposed in Japanese Patent Laid-Open No. 06-260391. In the illustrated case, the measurement light MM is inclined at an angle A with respect to a boundary line between regions differing in reflectance such that the measurement is performed in a direction denoted by α'. FIG. 20 illustrates intensity distributions of the reflected lights at three cross-sections spaced from each other in a direction denoted by β', i.e., at cross-sections AA', BB' and CC'. The reflected light has good symmetry at the cross-sections AA' and CC'. At the cross-section BB' including the regions differing in reflectance, the reflected light has an asymmetrical profile. In other words, the barycenter of the reflected light is shifted from a predetermined position and measurement errors are generated. Accordingly, the waveform of a signal detected by receiving the reflected light becomes asymmetrical and the contrast of the detected signal waveform deteriorates significantly, thus causing a difficulty in accurately measuring the wafer surface position. Such a difficulty results in a large defocus and a chip failure.

As described above, the intensity of the reflected light is changed due to interference generated by lights reflected from the front and rear surfaces of the resist depending on the patterns on the wafer. In some cases, therefore, it is difficult to accurately detect a position on the wafer surface by receiving the reflected light.

FIG. 23 illustrates the construction of a surface shape measuring apparatus disclosed in U.S. Pat. No. 6,249,351. The disclosed surface shape measuring apparatus includes a light source 101, a lens 103, a beam splitter 105, a reference mirror 130, a beam combiner 170 in the form of a diffraction grating, a lens 171, a lens 173, and a photoelectric conversion element 175. In that surface shape measuring apparatus, light is obliquely illuminated to a sample 360 and the shape of the sample 360 is determined from an interference signal detected by the photoelectric conversion element 175. The light received by the photoelectric conversion element 175 includes the reflected light from the front surface of a resist and the reflected light from the rear surface of the resist. This raises a difficulty in accurately measuring the shape of the resist front surface. FIG. 21 illustrates an interference signal obtained in the known apparatus, illustrated in FIG. 23, when the sample 360 is scanned by an actuator 397 in a direction perpendicular to the sample surface. The interference signal in FIG. 21 is obtained when measuring a sample which has no patterns on a wafer and which is coated with only a resist, as illustrated in FIG. 22. Because the received light includes not only the reflected light from the front surface of the resist but also the reflected light from the rear surface of the resist, the resulting interference signal is measured in such a state that the interference generated by the reflected light from the rear surface of the resist affects the interference generated by the reflected light from the front surface of the resist in a superimposed manner. This leads to a difficulty in accurately detecting height information of the resist front surface by using only the reflected light from the front surface of the resist. To measure the interference signal while separating the reflected lights from the front and rear surfaces of the resist, U.S. Pat. No. 6,249,351 proposes a method of increasing the reflectance at the front surface of the resist by increasing an incident angle upon the substrate. U.S. Pat. No. 6,249,351 says that the proposed method is effective in relatively intensifying the reflected light from the front surface of the resist on the substrate as compared with the reflected light from the rear surface of the resist.

However, when the substrate is made of Al or Cu and has high reflectance, the rear surface of the resist (i.e., the resist/substrate interface) has high reflectance to such an extent that the influence of the reflected light from the rear surface of the resist cannot be sufficiently suppressed even when the incident angle of the light upon the substrate is set to a large value. Accordingly, errors are generated in a value resulting from measuring the resist front surface.

Further, when a gas gauge sensor is used as described in PCT Application Domestic Laid-Open No. 2006-514744, specific problems arise in that fine particles mixed in gas are also sprayed onto the wafer, and that the gas gauge sensor cannot be used in an exposure apparatus operating in vacuum, e.g., an EUV (Extreme Ultraviolet) exposure apparatus using an extreme ultraviolet light, because a degree of vacuum deteriorates with the sprayed gas.

SUMMARY OF THE INVENTION

According to an aspect of the present invention, a surface shape measuring apparatus can high-accurately measure a surface shape without being affected by reflectance distribution of a substrate and interference caused by a thin film.

According to another aspect of the present invention, there is provided a surface shape measuring apparatus configured to measure a surface shape of a film formed on a substrate. The surface shape measuring apparatus includes an illumination system arranged to split wide-band light from a light source into measurement light and reference light, the measurement light being illuminated to obliquely enter a surface of the film, the reference light being illuminated to obliquely enter a reference mirror, a light receiving system arranged to combine the measurement light reflected by the surface of the film and the reference light reflected by the reference mirror with each other and to introduce the combined light to a photoelectric conversion element, and a processing unit configured to calculate the surface shape of the film based on an interference signal detected by the photoelectric conversion element. An incident angle of the measurement light upon the surface of the film and an incident angle of the reference light upon the reference mirror are each larger than the Brewster's angle. S-polarized light and p-polarized light included in the measurement light entering a surface of the substrate have equal intensity on the photoelectric conversion element.

With the surface shape measuring apparatus according to an aspect of the present invention, errors generated in the optical measurement can be reduced by suppressing the influence of the reflected light from the rear surface of a resist (film) based on properties that the phase of the p-polarized light is changed when the incident angle is larger than the Brewster's angle. Therefore, a surface shape measuring apparatus capable of accurately measuring the front surface position of a film, such as a resist is provided. Further, an exposure apparatus is provided which can realize high focus accuracy with respect to a small focal depth and which can increase yields.

Further features of the present invention will become apparent from the following description of exemplary embodiments with reference to the attached drawings.

BRIEF DESCRIPTION OF THE DRAWINGS

FIG. 5A is a graph illustrating phase changes of reflected light from a front surface of a resist (i.e., an air/resist interface) with respect to an incident angle.

FIG. 5B is a graph illustrating phase changes of reflected light from a rear surface of the resist (i.e., a resist/Al interface) with respect to an incident angle.

FIG. 6 is a graph illustrating an interference signal resulting from each of the reflected lights from the front and rear surfaces of the resist.

DESCRIPTION OF THE EMBODIMENTS

Figure 1:
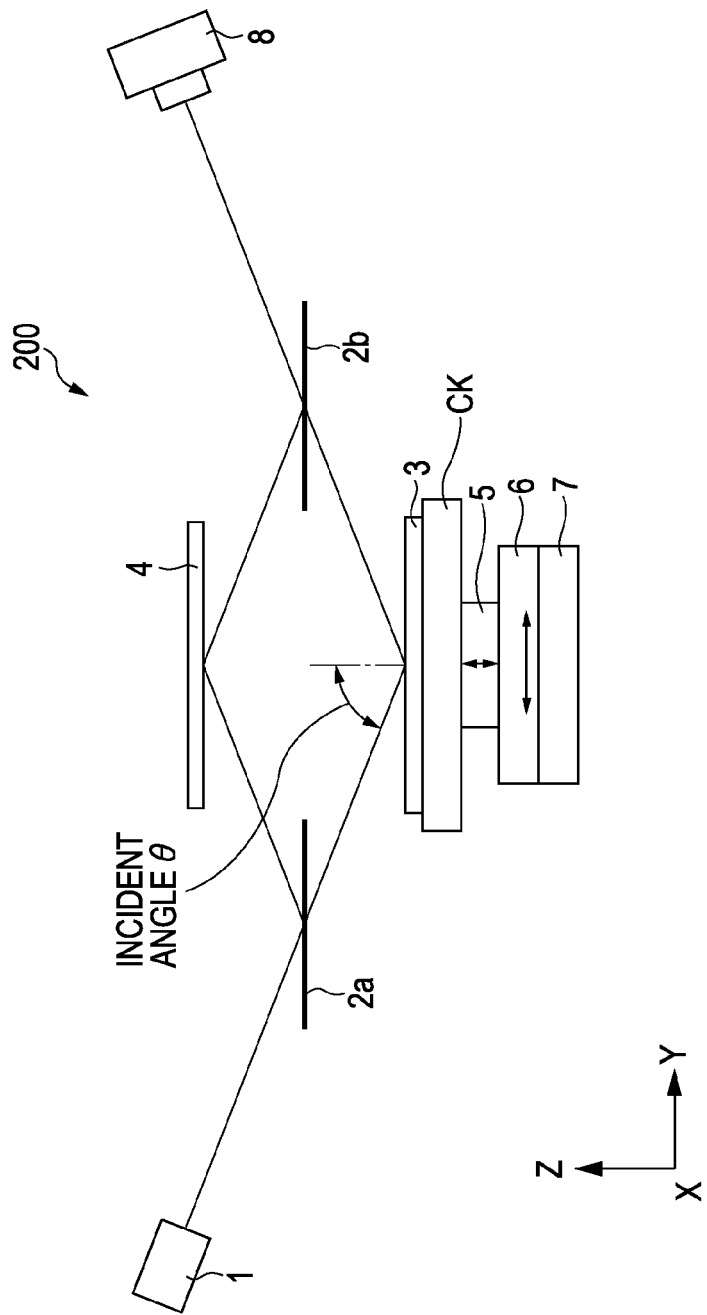
FIG. 1 is a block diagram of a surface shape measuring apparatus according to a first exemplary embodiment of the present invention.

Exemplary embodiments of the present invention will be described below with reference to the accompanying drawings. Note that, throughout the drawings, the same components are denoted by the same reference numerals, and redundant description is omitted.

FIG. 1 is a block diagram of a surface shape measuring apparatus 200 according to a first exemplary embodiment of the present invention. The surface shape measuring apparatus 200 is an apparatus configured to detect the surface position of a film on a substrate 3, i.e., a measurement target having the film on its surface, in the height direction (Z-direction). More specifically, the surface shape measuring apparatus 200 includes a light source 1 provided as a halogen lamp or an LED (including the so-called white LED) each emitting wide-band light, a beam splitter (BS) 2a arranged to branch the light, and a substrate chuck CK arranged to hold the measurement target 3. Further, the surface shape measuring apparatus 200 includes a Z-stage 5, a Y-stage 6, and an X-stage 7 which are configured to align the position of the measurement target, a reference mirror 4, a beam splitter (BS) 2b arranged to combine light reflected by the reference mirror 4 and light reflected by the substrate 3 with each other, and an image pickup device 8, e.g., a CCD or CMOS sensor. In this exemplary embodiment, a resist is formed as the film on the surface of the substrate 3.

Functions and examples of various components will be described below. In FIG. 1, the light emitted from the light source 1 is split by the beam splitter 2a into two light beams each having light quantity substantially half that of the emitted light. The two light beams enter respectively the substrate 3 and the reference mirror 4 at the same incident angle θ.

A wavelength band of the light source 1 can be set so as to cover wavelengths from 400 nm to 800 nm. However, the wavelength band is not limited to such a range and is desirably set to be not lower than 100 nm. When a resist is formed on the substrate 3, light with wavelengths of not larger than the ultraviolet wavelength (350 nm) should not be illuminated to the substrate 3 for the reason of preventing sensitization of the resist.

The beam splitter 2a can be formed as a cubic beam splitter using, as a split film, a thick film, e.g., a metal film or a dielectric multilayer film, or a pellicle beam splitter formed of a thin film (made of SiC or SiN) having a thickness of about 1 μm to 5 μm.

Of measurement light and reference light split by the beam splitter 2a, the measurement light is illuminated to the substrate 3 and enters the beam splitter 2b after being reflected by the substrate 3. On the other hand, the reference light is illuminated to the reference mirror 4 and enters the beam splitter 2b after being reflected by the reference mirror 4. The reference mirror 4 can be formed of a glass plane mirror with surface accuracy of about 10 nm to 20 nm.

The measurement light reflected by the substrate 3 and the reference light reflected by the reference mirror 4 are combined with each other through the beam splitter 2b and are received by the image pickup device 8. Interference light generated by superimposition of the measurement light reflected by the substrate 3 with the reference light reflected by the reference mirror 4 enters a light receiving surface of the image pickup device 8. The beam splitter 2b can be the same as the beam splitter 2a.

In this first exemplary embodiment, incident angles upon the substrate 3 and the reference mirror 4, physical properties of the reference mirror 4, a light polarization state are three important points for suppressing the influence of reflected light from the rear surface of the film on the substrate. Those points will be described in detail below.

Figure 2:
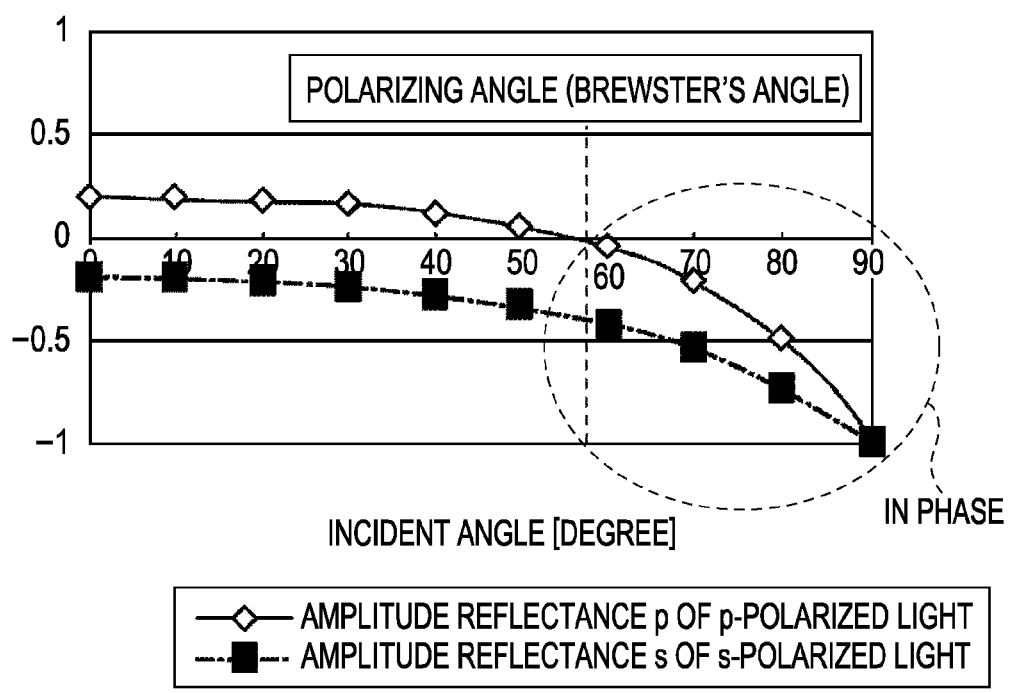
FIG. 2 is a graph illustrating changes of amplitude reflectance with respect to an incident angle (i.e., the Fresnel's relation).
Figure 3:
FIG. 3 illustrates a model used in a simulation illustrated in FIG. 2.

First, in this first exemplary embodiment, the reference light and the measurement light are illuminated to enter the reference mirror 4 and the front surface of the film on the substrate 3 at incident angles larger than the Brewster's angle (also called the polarizing angle). When the incident angle of the incident light is larger than the Brewster's angle, the phase of a p-polarized component of the reflected light is reversed. That feature is described with reference to FIG. 2. FIG. 2 is a graph illustrating changes of amplitude reflectance for each of s-polarized light and p-polarized light with respect to an incident angle in a structure of FIG. 3. Herein, the reflectance (representing a value for light having a wavelength of 550 nm) of the resist is assumed to be 1.5. As seen from FIG. 2, the amplitude reflectance of the s-polarized light is negative with respect to entire changes of an incident angle θ upon the resist. On the other hand, the amplitude reflectance of the p-polarized light becomes 0 at the incident angle θ of about 57 degrees, and its sign is changed from positive to negative at a larger incident angle. The incident angle at which the amplitude reflectance of the p-polarized light becomes 0 is called the Brewster's angle or the polarizing angle. Thus, when the incident angle is larger than the Brewster's angle, the s-polarized light and the p-polarized light are both negative in sign of the amplitude reflectance and are in phase.

Figure 4:
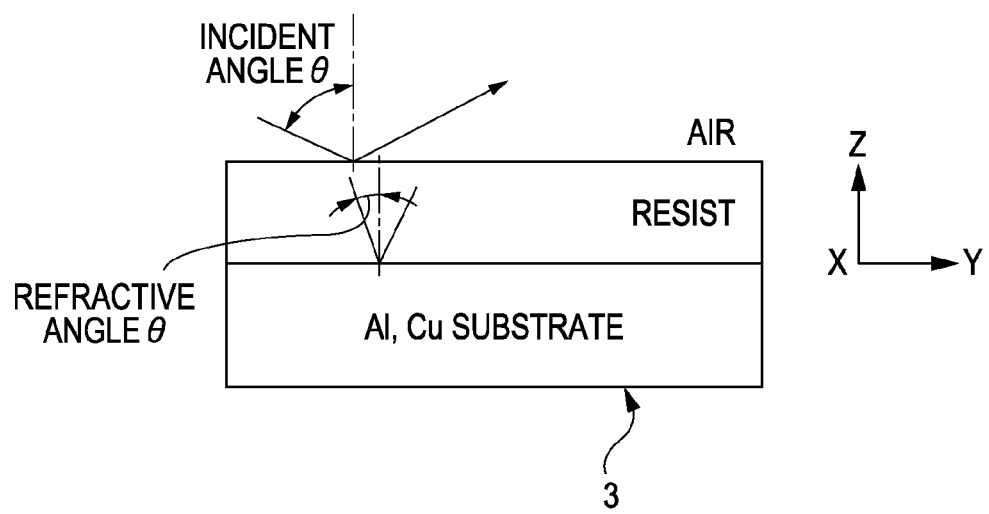
FIG. 4 illustrates a model used in a simulation illustrated in FIGS. 5A and 5B.

FIG. 4 illustrates the structure of a high-reflectance substrate made of, e.g., Al or Cu. The term "high-reflectance substrate" implies not only a substrate having a high reflectance in itself, but also a substrate in which a film having a high reflectance is formed on a Si-substrate. FIGS. 5A and 5B are graphs illustrating phase changes of the s-polarized light and the p-polarized light, which are included in the reflected light, when the high-reflectance substrate has the structure of FIG. 4. As seen from FIG. 5A, when the incident angle θ upon the resist front surface is larger than the Brewster's angle, the phase of a p-polarized component in the reflected light from the resist front surface is reversed and the s-polarized light and the p-polarized light are in phase. On the other hand, because a refractive angle θ' in the resist is smaller than the incident angle upon the resist front surface in accordance with the Snell's law, the incident angle upon the substrate becomes smaller than the Brewster's angle. Accordingly, as seen from FIG. 5B, a phase difference of about π is generated between the s-polarized light component and the p-polarized light component which are included in the reflected light from the resist rear surface (i.e., the resist/substrate interface).

The light is caused to enter the reference mirror 4 at an incident angle larger than the Brewster's angle so that, as illustrated in FIG. 5A, the s-polarized light component and the p-polarized light component both included in the reflected light are in phase. Further, in view of contrast of an interference signal, a substrate of the reference mirror 4 and a film formed on the substrate are desirably made of specific materials. For example, the film can be made of a material having a refractive index close to that of the resist on the substrate 3, such as $SiO_2$, SiN or SiC. Because the coherence length for white-light interference is as short as several microns, the reference mirror 4 is desirably made of a substrate having a thickness of not smaller than several microns to prevent interference caused by reflected light from the rear surface of the reference mirror. Alternatively, the film having the refractive index close to that of the resist on the measurement target substrate can be formed on the substrate of the reference mirror 4 in thickness of several microns or more.

FIG. 6 illustrates the simulated waveform of an interference signal measured when the incident light enters the substrate having the structure of FIG. 4 at an incident angle of 80 degrees. In a simulation, the film thickness of the resist is set to 2 μm such that an interference signal resulting from the reflected light from the resist front surface and an interference signal resulting from the reflected light from the resist rear surface are separated from each other. Because the reflected light from the resist front surface and the reflected light from the reference mirror are in phase, there is no phase shift between an s-polarized light component and a p-polarized light component of the interference signal resulting from the reflected light from the resist front surface. On the other hand, because the interference signal resulting from the reflected light from the resist rear surface contains a phase difference π between the reflected light from the resist rear surface and the reflected light from the reference mirror, waveforms of the interference signals for the s-polarized light component and the p-polarized light component have phases reversed to each other. Therefore, by performing an adjustment such that the measurement light and the reference light include the s-polarized light and the p-polarized light at equal intensity, the s-polarized light component and the p-polarized light component of the reflected light from the resist rear surface are canceled each other. As a result, the signal intensity of the reflected light from the resist rear surface can be reduced.

Thus, the position of the substrate surface can be accurately measured by satisfying three conditions, i.e., the incident angle θ being larger than the Brewster's angle, the reference mirror 4 using the material which has the refractive index close to that of the resist, and no-polarization.

Generally, light from a light source has polarization. In an interferometer, even when s-polarized light and p-polarized light included in the light from the light source have equal intensity, a beam splitter has differences in reflectance and transmittance between both the polarized lights. This raises a difficulty in making the intensities of the s-polarized light and the p-polarized light in the interference signal resulting from the reflected light from the resist rear surface exactly matched with each other. Stated another way, when the light is introduced in the no-polarization state, for example, the s-polarized light and the p-polarized light in the interference signal resulting from the reflected light from the resist rear surface are not completely cancelled each other and the accurate measurement of the position of the resist front surface is impeded in some cases. A method of adjusting the light polarization state according to the first exemplary embodiment will be described below.

A substrate is prepared which has a film formed in thickness of several microns, the film being the same as a thin film (resist in this case) on the measurement target substrate or having the refractive index equivalent to that of the thin film. The prepared substrate is placed in the measuring apparatus, and an intensity ratio of the s-polarized light to the p-polarized light is adjusted such that the influence of the interference signal resulting from the reflected light from the resist rear surface is minimized. The substrate used for adjusting the intensity ratio of the s-polarized light to the p-polarized light needs to be made of a material that is practically used in the actual semiconductor process. Specifically, Si, Al, W and Cu are materials currently used. In the exemplary embodiment of the present invention, by using a Si substrate or the like to perform the adjustment, the advantages of the present invention are obtained when the measurement target substrate is made of the material currently used in the semiconductor process. If a different material other than Si is used as the material of the substrate in the semiconductor process in future, the present invention can be implemented by performing the adjustment while the different material is used for the substrate. However, when the substrate is made of a material other than Si, there is a possibility that the adjusted state of the intensity ratio of the s-polarized light to the p-polarized light is changed. In such a case, the present invention can be implemented by adjusting the intensity ratio through the steps of arranging two or more polarization adjusting elements which are selectively changeable, and inserting one of the polarization adjusting elements in place depending on the substrate used.

Though not illustrated in FIG. 1, an achromatic λ/2-plate is disposed, as a unit to adjust the polarization state of the light emitted from the light source 1, between the light source 1 and the beam splitter 2a. The achromatic λ/2-plate is formed in combination of two types of crystal materials having different retardation characteristics and an air space therebetween, and it serves to provide a phase difference of λ/2 between two orthogonal polarized light components in the wavelength range of the light source 1. The achromatic λ/2-plate can be provided as one of commercially available plates. In addition, a rotation drive unit (not shown) is attached to the achromatic λ/2-plate such that the intensity ratio of the s-polarized light to the p-polarized light in the interference signal resulting from the reflected light from the resist rear surface can be adjusted by rotating the achromatic λ/2-plate. With such an adjusting method, since the substrate having a thick resist structure is employed, the interference signal resulting from the reflected light from the resist front surface and the interference signal resulting from the reflected light from the resist rear surface can be separated from each other in an oblique-incidence white-light interferometer. Instead of placing the substrate, the polarization state can also be adjusted by preparing a structure in which a film having the refractive index close to that of the film on the measurement target substrate is formed in thickness of several microns on a reference mark 39 (see FIG. 13) disposed on a wafer stage, and by utilizing the reference mark having such a structure. Thus, by adjusting the above-described intensity ratio in the separated interference signal resulting from the reflected light from the resist rear surface, the influence of the interference signal resulting from the reflected light from the resist rear surface can be suppressed. When the surface shape of a thin film is measured, the film surface exhibits a higher reflectance at a larger incident angle. Therefore, the incident angle is desirably set to be as large as possible. In a practical example, the incident angle is set to 70 degrees or more. However, when the incident angle approaches 90 degrees, a difficulty arises in assembling the optical system.

A method of obtaining the interference signal will be described below. In FIG. 1, the substrate 3 is held by the substrate chuck Ck and is placed on the Z-stage 5, the Y-stage 6, and the X-stage 7. The Z-stage 5 is driven to obtain the interference signal, illustrated in FIG. 7, with the image pickup device 8, and the light intensity at each of pixels of the image pickup device 8 corresponding to a reflection point on the substrate 3 is stored in a storage (not shown). When the measurement region on the substrate 3 is changed, the above-described measurement is performed after positioning a desired measurement region to be aligned with the light receiving region of the image pickup device 8 by operating the X-stage 7 or the Y-stage 6. To accurately control the positions of the X-stage, the Y-stage, and the Z-stage, though not illustrated in FIG. 1, a laser interferometer is disposed for each of five axes, i.e., three X-, Y- and Z-axes, and two tilt axes of ωx and ωy. The shape measurement can be performed with higher accuracy by executing closed loop control based on outputs of the laser interferometers. When global shape measurement of the entire substrate 3 is performed by dividing the substrate 3 into plural regions, more accurate stitching of shape data can be realized by using the laser interferometers.

Figure 7:
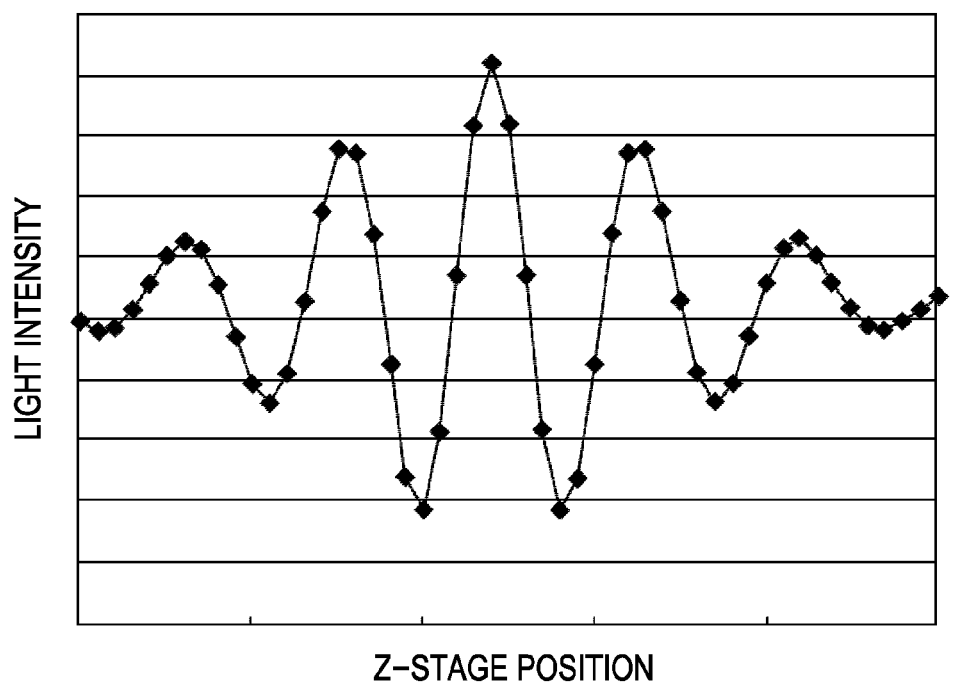
FIG. 7 is a graph illustrating an interference signal obtained in the first exemplary embodiment of the present invention.

A description is now made of a method of measuring the shape of the substrate 3 by processing the interference signal which has been obtained by the image pickup device 8 and stored in the storage. FIG. 7 illustrates an interference signal obtained at a certain pixel by the image pickup device 8. The illustrated interference signal is also called an interferogram. In a graph of FIG. 7, the horizontal axis represents a value (position of the Z-stage) measured by a Z-axis gauge interferometer (or one of other gauge sensors such as an electrostatic capacitance sensor), and the vertical axis represents the output of the image pickup device 8. By calculating the position of a peak of the interference signal, the value measured by the Z-axis gauge interferometer corresponding to the position of the signal peak provides a measured value of the height at the relevant pixel. The three-dimensional shape of the substrate 3 can be determined by measuring the height at each of all pixels of the image pickup device 8. The position of the signal peak can be calculated with curve approximation (using, e.g., a curve of quadratic function) based on data obtained at the position of the signal peak and several points around the former. With the curve approximation, the peak position can be calculated at resolution of 1/10 or less of a sampling pitch Zp along the Z-axis, i.e., the horizontal axis of FIG. 7. The sampling pitch Zp can be set by actually driving the Z-stage 5 at a constant pitch of Zp in a stepwise manner, or by driving the Z-stage 5 at a constant speed and taking in the interference signal through time sampling that provides the sampling pitch Zp. A known FDA method (described in U.S. Pat. No. 5,398, 113) can also be used as the method of measuring the peak position. According to the FDA method, a peak position of contrast is determined by using a phase gradient of a Fourier spectrum.

In the white-light interference process, a key factor affecting the resolution is accuracy in determining the position where a difference in optical path between the reference light and the measurement light is 0. For that purpose, in addition to the FDA method, several fringe analysis methods are proposed as known techniques, including a method of obtaining an envelope line of white-light interference fringes by a phase shift method or a Fourier transform method and determining, from a maximum fringe contrast position, a point where the difference in optical path is zero, as well as a phase cross method.

Figure 8:
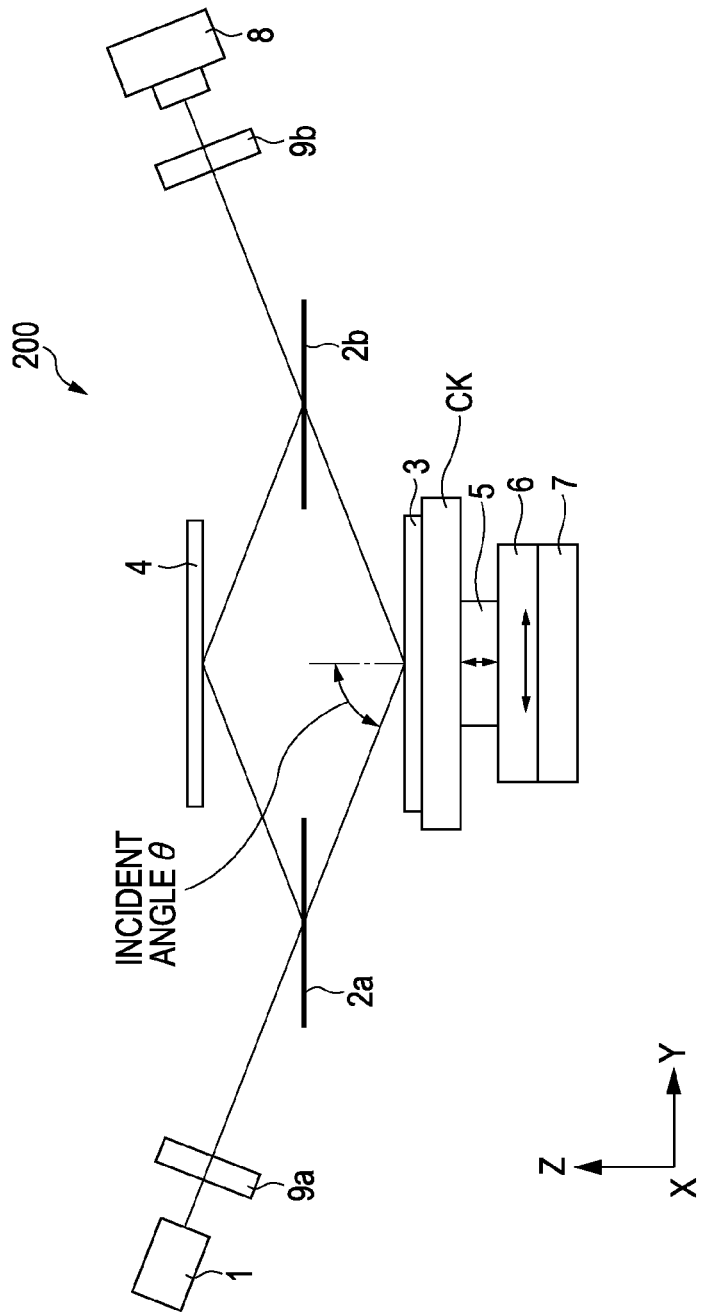
FIG. 8 is a block diagram of a surface shape measuring apparatus according to a second exemplary embodiment of the present invention.

A second exemplary embodiment of the present invention will be described below in connection with a surface shape measuring apparatus having a different construction from that of the first exemplary embodiment. FIG. 8 is a block diagram of a surface shape measuring apparatus 200 according to the second exemplary embodiment of the present invention. The surface shape measuring apparatus 200 is an apparatus configured to detect the Z-directional position of the surface of a substrate 3, i.e., a measurement target. More specifically, the surface shape measuring apparatus 200 includes a light source 1, a first polarizer 9a, a beam splitter 2a arranged to branch light, and a substrate chuck CK arranged to hold the measurement target 3, as well as a Z-stage 5, a Y-stage 6, and an X-stage 7 which are configured to align the position of the measurement target. The surface shape measuring apparatus 200 further includes a reference mirror 4, a beam splitter 2b arranged to superimpose light reflected by the reference mirror 4 and light reflected by the substrate 3 with each other, a second polarizer 9b, and an image pickup device 8, e.g., a CCD or CMOS sensor. The substrate 3 is a wafer having a resist film formed on its surface.

Functions and examples of various components will be described below.

In FIG. 8, the light emitted from the light source 1 passes through the first polarizer 9a before entering the substrate 3 and the reference mirror 4. Two light beams split by the beam splitter 2a enter respectively the substrate 3 and the reference mirror 4 at the same incident angle θ. Measurement light reflected by the substrate 3 and reference light reflected by the reference mirror 4 enter the beam splitter 2b. Since the light source 1, the incident angle θ, the beam splitters 2a and 2b, and the reference mirror 4 are the same as those in the first exemplary embodiment, a description of those components is not repeated here. The beam splitter 2b can be the same as the beam splitter 2a. The measurement light and the reference light are received by the image pickup device 8 after passing through the second polarizer 9b. After being reflected respectively by the substrate 3 and the reference mirror 4, the measurement light and the reference light are superimposed with each other through the beam splitter 2b to generate interference light that enters a light receiving surface of the image pickup device 8.

A method of obtaining an interference signal using the light from the light source and a method of processing the interference signal are the same as those in the first exemplary embodiment. Therefore, a description of those methods is not repeated here.

This second exemplary embodiment differs from the first exemplary embodiment in that the polarizers 9a and 9b are disposed respectively in optical paths upstream and downstream of the substrate 3 and the reference mirror 4. With such an arrangement, after the polarization state of the light emitted from the light source 1 has been changed to linear polarization, the light is caused to enter each of the substrate 3 and the reference mirror 4 at an angle larger than the Brewster's angle. The reflected lights from the substrate 3 and the reference mirror 4 are received by the image pickup device 8 in the same state of linear polarization as that of the polarized lights incident upon the substrate 3 and the reference mirror 4.

Figure 9:
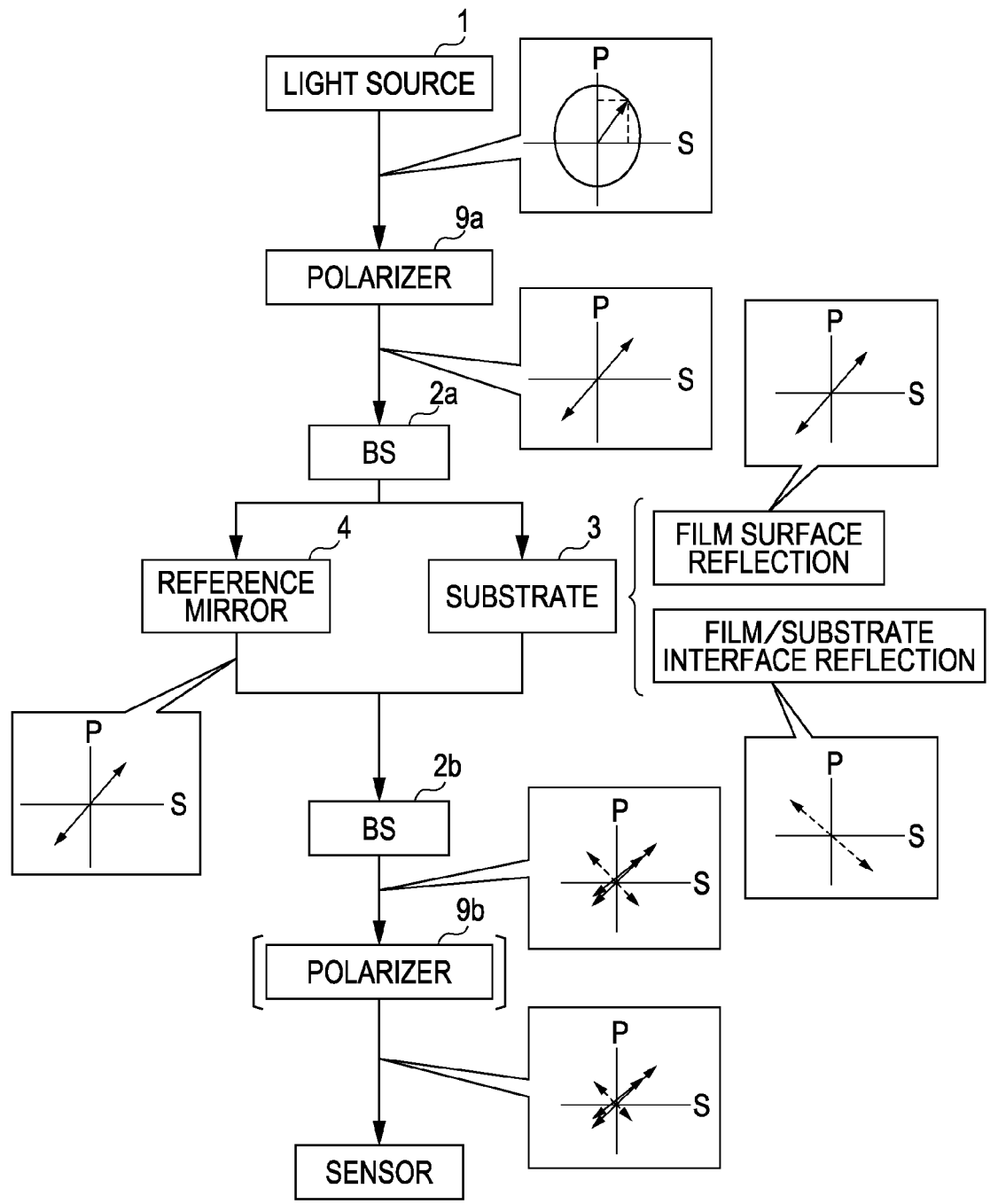
FIG. 9 illustrates polarization states at various points in the surface shape measuring apparatus according to the second exemplary embodiment of the present invention.

Changes of the polarization state of the light emitted from the light source until reception by the image pickup device 8 in this second exemplary embodiment will be described below with reference to FIG. 9. The polarization state of the light emitted from the light source 1 is changed to linear polarization by the first polarizer 9a. FIG. 9 illustrates the case where the polarization state of the light having been emitted from the light source 1 and having passed through the first polarizer 9a is linear polarization of +45° direction.

Phases of the reflected lights from the substrate 3 and the reference mirror 4 are changed with respect to the incident angle as illustrated in FIGS. 2, 5A, and 5B. Therefore, the orientation of polarization of the reflected light from the film front surface is not changed and that reflected light remains the linear polarization of +45° direction. On the other hand, because a phase difference π is generated between the reflected light from the film/substrate interface and the reflected light from the reference mirror 4, the reflected light from the film/substrate interface is changed to linear polarization of −45° direction. As a result, the interference signals resulting from the reflected lights from the film front surface and the film/substrate interface have two orthogonal linearly polarized components of +45° direction and −45° direction. Thus, only the component of the interference signal resulting from the reflected light from the film/substrate interface can be taken out by extracting only the component with the linear polarization of +45° direction through the second polarizer 9b after the reflection by the substrate 3 and the reference mirror 4. Similarly, when the polarization state of the light having been emitted from the light source 1 and having passed through the first polarizer 9a is linear polarization of −45° direction, a phase difference π is generated between the reflected light from the film/substrate interface and the reflected light from the reference mirror 4, and only the component of the interference signal resulting from the reflected light from the film front surface can be taken out. In other words, the influence of the interference signal resulting from the reflected light from the film/substrate interface can be suppressed by employing the above-described reference mirror 4, setting the incident angle θ to be larger than the Brewster's angle, and illuminating the incident light in the polarization state of the linear polarization. Although a larger light quantity than that in the first exemplary embodiment is needed because of using the polarizers, the interference signal resulting from the reflected light from the resist rear surface can be effectively removed and the surface shape of the resist coated on the wafer can be accurately measured.

A method of adjusting the light polarization state in the second exemplary embodiment will be described below.

A substrate is prepared which has a film formed in thickness of several microns, the film being the same as a thin film (resist in this case) on the measurement target substrate or having the refractive index equivalent to that of the thin film. The prepared substrate is placed in the measuring apparatus, and an intensity ratio of the s-polarized light to the p-polarized light is adjusted such that the influence of the interference signal resulting from the reflected light from the resist rear surface is minimized. A rotation drive unit (not shown) is attached to each of the polarizers 9a and 9b in FIG. 8 such that the above-described intensity ratio in the interference signal resulting from the reflected light from the resist rear surface can be adjusted by rotating the polarizers 9a and 9b. With such an adjusting method, since the substrate having a thick resist structure is employed, the interference signal resulting from the reflected light from the resist front surface and the interference signal resulting from the reflected light from the resist rear surface can be separated from each other in an oblique-incidence white-light interferometer. Instead of placing the substrate, the polarization state can also be adjusted by preparing a structure in which a film having the refractive index close to that of the film on the measurement target substrate is formed in thickness of several microns on a reference mark 39 (see FIG. 13) disposed on a wafer stage, and by utilizing the reference mark having such a structure. Thus, by adjusting the above-described intensity ratio in the separated interference signal resulting from the reflected light from the resist rear surface, the influence of the interference signal resulting from the reflected light from the resist rear surface can be suppressed.

Instead of rotating the polarizer, the polarization state of the light from the light source can also be adjusted by arranging a λ/2-plate, including a rotation drive unit, downstream of the polarizer and rotating the λ/2-plate. In measuring the position of the resist front surface, the interference signal resulting from the reflected light from the resist front surface provides a signal (S) to be measured, and the interference signal resulting from the reflected light from the resist rear surface becomes noise (N). Because the shape measurement of the resist front surface can be performed with higher accuracy at a larger S/N ratio, the above-described intensity ratio is adjusted depending on the demanded accuracy in the shape measurement. For example, the intensity ratio is desirably adjusted to such a value as providing the S/N ratio of not smaller than 10. When more accurate measurement is demanded, the S/N ratio can be set to be not smaller than 20 or 30. To that end, in this second exemplary embodiment, the linearly polarized light having passed through the polarizer 9a is adjusted to fall within ±1° relative to the direction of +45° and the direction of −45°. The reason is that, when the linearly polarized light is oriented at an angle other than ±45°, the interference signals resulting from the reflected light from the film front surface and the film/substrate interface are not orthogonal to each other. Thus, due to the presence of a component causing interference with the reflected light from the resist rear surface, the S/N ratio is reduced and a difficulty arises in performing the surface shape measurement with high accuracy.

The frequency of adjusting the polarization state is set, for example, such that, after performing the adjustment at delivery of the apparatus, the adjustment is performed just when a part of the apparatus, e.g., the light source, is replaced. Further, the film surface shape of the measurement target substrate can also be measured after separately preparing a film with a relatively large thickness (several microns) depending on the measurement target substrate and adjusting the polarization state by using a substrate including the relatively thick film formed thereon.

Even if the second polarizer 9b is not disposed, the reflected lights from the resist front surface and the resist rear surface are received as two linearly polarized components. On that occasion, when the received lights are two orthogonal linearly polarized components, the influence of the interference signal resulting from the reflected light from the resist rear surface can be suppressed because interference is generated only by the reference light and the reflected light from the resist front surface, which are in phase. From the viewpoint of contrast of the interference signal, the received lights are desirably two orthogonal linearly polarized components. In practice, however, phase changes are shifted due to the influence of the beam splitter, etc., and it is not easy to obtain the received light in the state of perfect linear polarization. For that reason, the second polarizer 9b is used in this second exemplary embodiment to further suppress the influence of the reflected light from the resist rear surface.

When the shape measurement is performed in a plurality of measurement regions on the substrate 3, the interference signal is obtained and processed similarly to the first exemplary embodiment after the wafer stage has been moved for alignment with each of the predetermined regions by driving the X-stage and the Y-stage.

Figure 10:
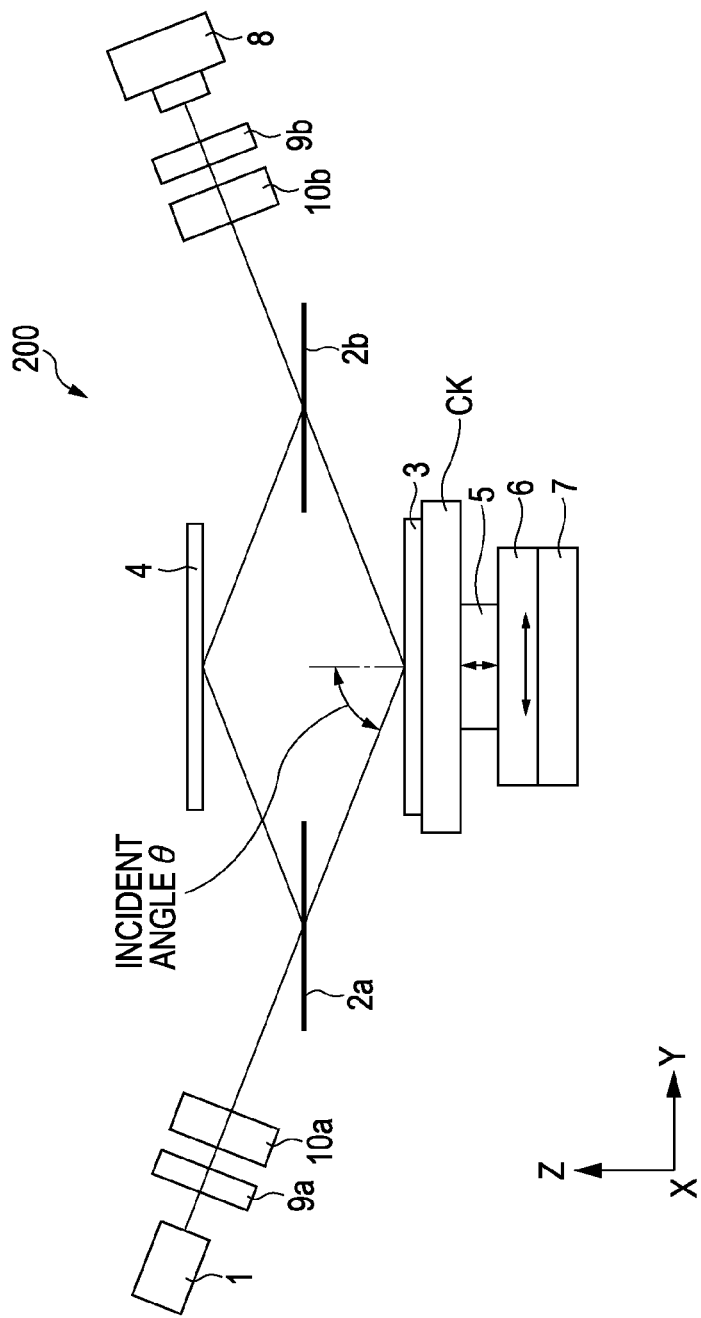
FIG. 10 is a block diagram of a surface shape measuring apparatus according to a third exemplary embodiment of the present invention.

A third exemplary embodiment of the present invention will be described below in connection with a surface shape measuring apparatus having a different construction from those of the first and second exemplary embodiments. FIG. 10 is a block diagram of a surface shape measuring apparatus 200 according to the third exemplary embodiment of the present invention. The surface shape measuring apparatus 200 is an apparatus configured to detect the Z-directional position of the surface of a substrate 3, i.e., a measurement target. More specifically, the surface shape measuring apparatus 200 includes a light source 1, a first polarizer 9a, a first wavelength plate 10a, a beam splitter 2a arranged to branch light, and a substrate chuck CK arranged to hold the measurement target 3, as well as a Z-stage 5, a Y-stage 6, and an X-stage 7 which are configured to align the position of the measurement target. The surface shape measuring apparatus 200 further includes a reference mirror 4, a beam splitter 2b arranged to combine light reflected by the reference mirror 4 and light reflected by the substrate 3 with each other, a second polarizer 9b, a second wavelength plate 10b, and an image pickup device 8, e.g., a CCD or CMOS sensor.

Functions and examples of various components will be described in detail below.

In FIG. 10, the light emitted from the light source 1 passes through the first polarizer 9a and the first wavelength plate 10a before entering the substrate 3 and the reference mirror 4. Two light beams split by the beam splitter 2a enter respectively the substrate 3 and the reference mirror 4 at the same incident angle θ. Measurement light illuminated to and reflected by the substrate 3 and reference light illuminated to and reflected by the reference mirror 4 enter the beam splitter 2b. Since the light source 1, the incident angle θ, the beam splitters 2a and 2b, and the reference mirror 4 are the same as those in the first exemplary embodiment, a description of those components is not repeated here. The beam splitter 2b can be the same as the beam splitter 2a. The measurement light and the reference light are received by the image pickup device 8 after passing through the second wavelength plate 10b and the second polarizer 9b. After being reflected respectively by the substrate 3 and the reference mirror 4, the measurement light and the reference light are superimposed with each other on a light receiving surface of the image pickup device 8 to generate light interference.

The wavelength plate is formed of an achromatic λ/4-plate. The achromatic λ/4-plate is formed in combination of two types of crystal materials having different retardation characteristics and an air space therebetween, and it serves to provide a phase difference of λ/4 between two orthogonal polarized light components in a wide wavelength range. The achromatic λ/4-plate can be provided as one of commercially available plates.

A method of obtaining an interference signal using the light from the light source and a method of processing the interference signal are the same as those in the first exemplary embodiment. Therefore, a description of those methods is not repeated here.

This third exemplary embodiment differs from the first exemplary embodiment in that a set of the polarizer 9a and the wavelength plate 10a and a set of the polarizer 9b and the wavelength plate 10b are disposed respectively in optical paths upstream and downstream of the substrate 3 and the reference mirror 4. With such an arrangement, after the polarization state of the light emitted from the light source 1 has been changed from linear polarization (e.g., p-polarized light) to circular polarization, the light is caused to enter each of the substrate 3 and the reference mirror 4 at an incident angle θ. Of the reflected lights from the substrate 3 and the reference mirror 4, only light components oscillating in the same direction as that of the above-described linear polarization are received by the image pickup device 8.

Figure 11:
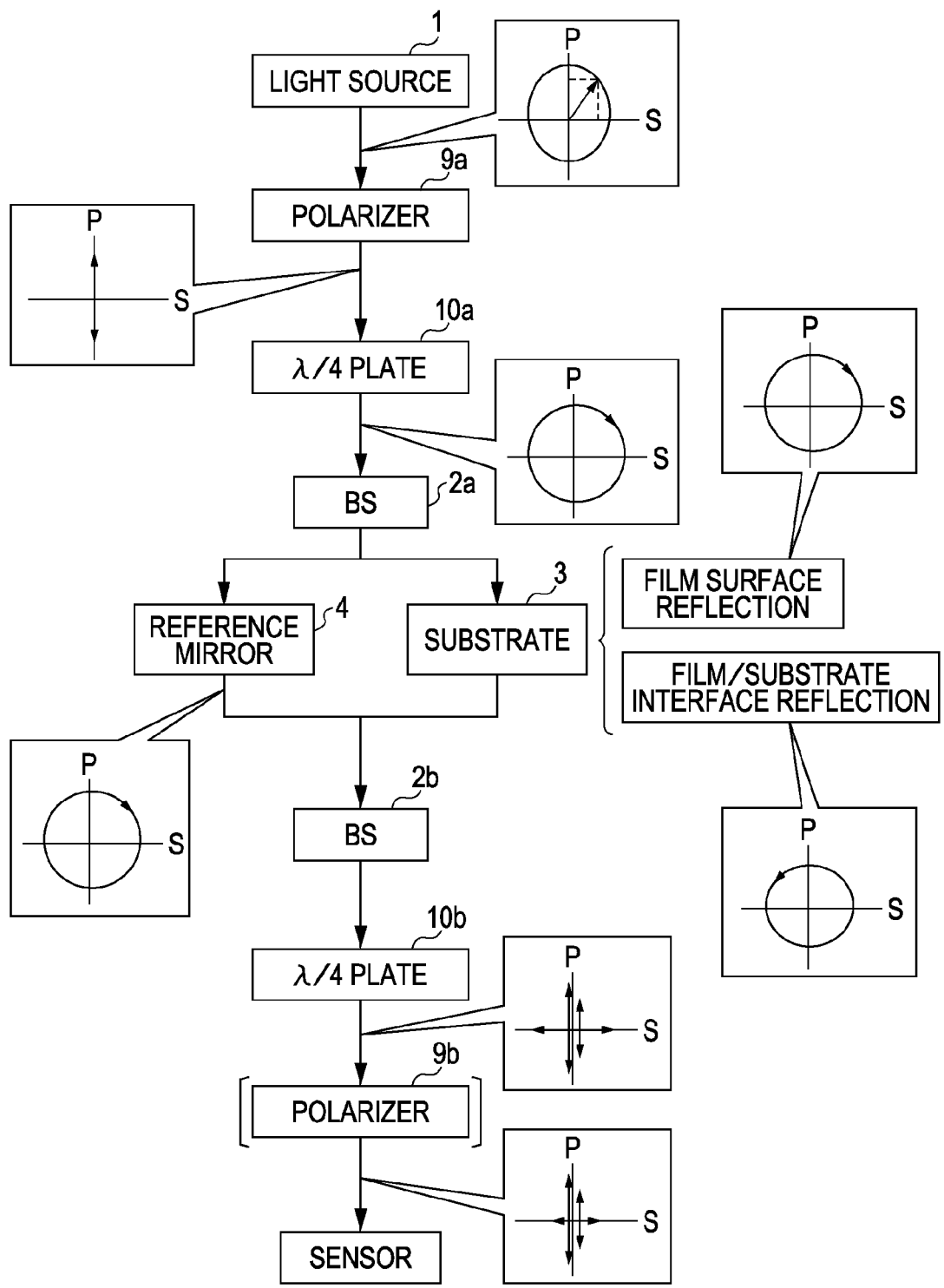
FIG. 11 illustrates polarization states at various points in the surface shape measuring apparatus according to the third exemplary embodiment of the present invention.

Changes of the light polarization state in this third exemplary embodiment will be described below with reference to FIG. 11. The polarization state of the light emitted from the light source 1 is changed to linear polarization by the polarizer 9a and then to circular polarization by the wavelength plate 10a. FIG. 11 illustrates the case where the polarization state of the light having been emitted from the light source 1 and having passed through the polarizer 9a and the wavelength plate 10a is right-hand circular polarization.

When the reference mirror 4 is employed, phases of the reflected lights from the substrate 3 and the reference mirror 4 are changed with respect to the incident angle as illustrated in FIGS. 2, 5A, and 5B. Therefore, the rotational direction of polarization of the reflected light from the film front surface is not changed and that reflected light remains the right-hand circular polarization. On the other hand, because a phase difference π is generated between the reflected light from the film/substrate interface and the reflected light from the reference mirror 4, the reflected light from the film/substrate interface is changed to left-hand circular polarization. As a result, the interference signals resulting from the reflected lights from the film front surface and the film/substrate interface can be obtained in the state that the right-hand and left-hand circular polarizations are converted respectively to a p-polarized component and s-polarized component after changing the circular polarization to the linear polarization through the wavelength plate 10b. Thus, only the component of the interference signal resulting from the reflected light from the film front surface interface can be taken out by extracting only the p-polarized component through the polarizer 9b. In other words, the influence of the interference signal resulting from the reflected light from the resist rear surface can be suppressed by employing the above-described reference mirror 4, illuminating the incident light at the incident angle θ larger than the Brewster's angle in the polarization state of circular polarization, converting the circular polarization to linear polarization components through the wavelength plate, and extracting the component of the reflected light from the resist front surface through the polarizer. Although a larger light quantity than that in the first exemplary embodiment is needed because of using the polarizers and the wavelength plates, the interference signal resulting from the reflected light from the resist rear surface can be effectively removed and the surface shape of the resist coated on the wafer can be accurately measured. An adjusting method can be performed, as described above in connection with FIG. 6, by forming, on a substrate, a film which is so thick as to sufficiently separate the front surface signal (i.e., the interference signal resulting from the reflected light from the resist front surface) and the rear surface signal (i.e., the interference signal resulting from the reflected light from the resist rear surface) from each other, and adjusting respective angles of the polarizers 9a and 9b and the wavelength plates 10a and 10b so that relative intensity of the rear surface signal is minimized with respect to the front surface signal.

Even if the second polarizer 9b is not disposed in this third exemplary embodiment, the reflected lights from the resist front surface and the resist rear surface are received as two orthogonal linearly polarized components, and interference is generated only by the reference light and the reflected light from the resist front surface, which are in phase. Accordingly, the influence of the interference signal resulting from the reflected light from the resist rear surface can be suppressed. In practice, however, phase changes are shifted due to the influence of the beam splitter, etc., and it is not easy to obtain the received light in the state of perfect linear polarization. For that reason, the second polarizer 9b is used in this third exemplary embodiment to further suppress the influence of the reflected light from the resist rear surface.

A method of adjusting the light polarization state can be performed in a similar manner to that in the above-described exemplary embodiments by attaching rotation drive units to the polarizers 9a and 9b or the wavelength plates 10a and 10b. More specifically, a substrate is prepared which has a film formed in thickness of several microns, the film being the same as a thin film (resist in this case) on the measurement target substrate or having the refractive index equivalent to that of the thin film. The prepared substrate is placed in the measuring apparatus. Then, an intensity ratio of the s-polarized light to the p-polarized light is adjusted by rotating the polarizers 9a and 9b or the wavelength plates 10a and 10b such that the influence of the interference signal resulting from the reflected light from the resist rear surface is minimized.

When the shape measurement is performed in a plurality of measurement regions on the substrate 3, the interference signal is obtained and processed similarly to the first exemplary embodiment after the wafer stage has been moved for alignment with each of the predetermined regions by driving the X-stage and the Y-stage.

Figure 12:
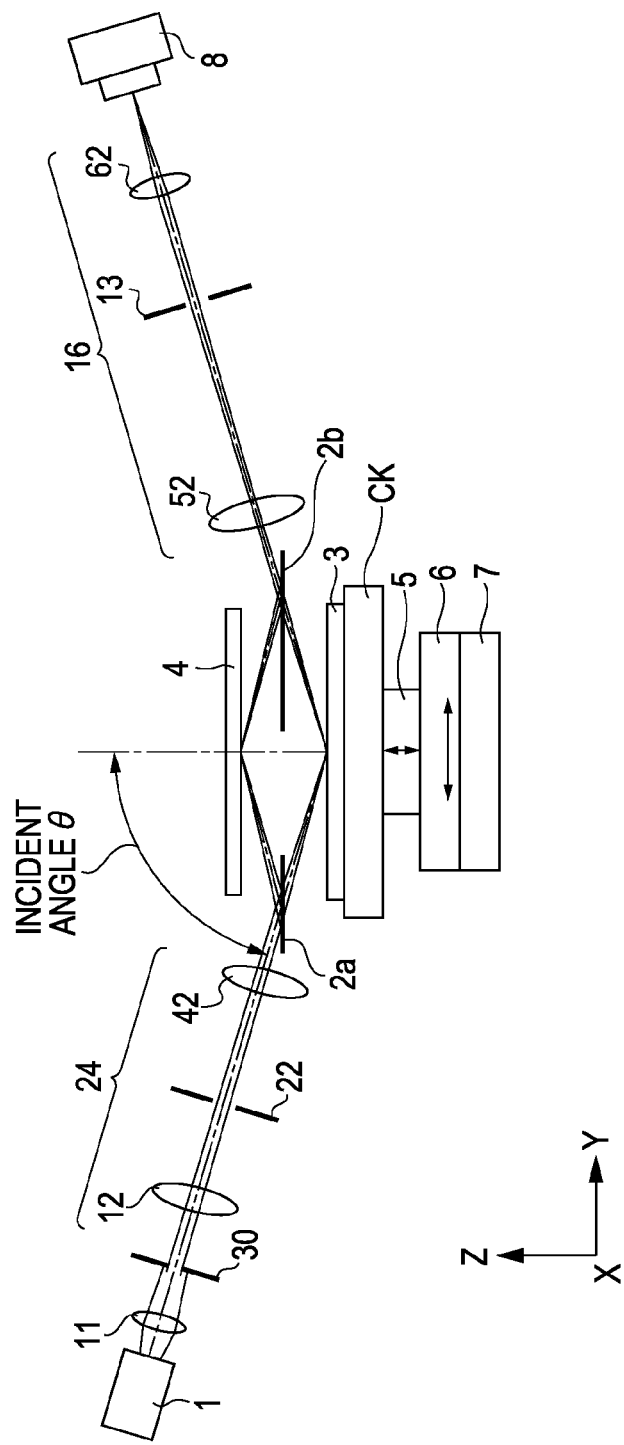
FIG. 12 is a block diagram of a surface shape measuring apparatus according to another aspect of the present invention.

The foregoing three exemplary embodiments have been described, for the brevity of explanation, as exemplary embodiments not using lens, etc. FIG. 12 is a block diagram of a surface shape measuring apparatus 200 according to another aspect of the present invention. An exemplary embodiment using an optical system made up of lenses, etc. will be described below with reference to FIG. 12. Light emitted from a light source 1 is condensed by a condenser lens 11 and passes through a transmission slit plate 30. The condensed light is imaged on respective surfaces of a substrate 3 and a reference mirror 4 through an imaging optical system 16 including lens 12, lens 42 and aperture stop 22 after being branched into two light beams by a beam splitter 2a. Reflected lights from the substrate 3 and the reference mirror 4 are superimposed with each other through the beam splitter 2b and are imaged on the image pickup device 8 through an imaging optical system 24 including lens 52, lens 62 and aperture stop 13. Thus, the surface of the substrate 3 can be imaged on the image pickup device 8. The transmission slit plate 30 is used to define a measurement region.

While the foregoing three exemplary embodiments have been described in connection with the case where the incident angles upon the substrate 3 and the reference mirror 4 are the same, the incident angles upon the substrate 3 and the reference mirror 4 are not necessarily needed to be the same so long as the reference mirror 4 satisfies the above-described conditions. Further, to increase contrast of the interference signal, respective intensities of the interference signals resulting from the reflected lights from the substrate 3 and the reference mirror 4 can be changed by adjusting the incident angles upon the substrate 3 and the reference mirror 4.

Figure 13:
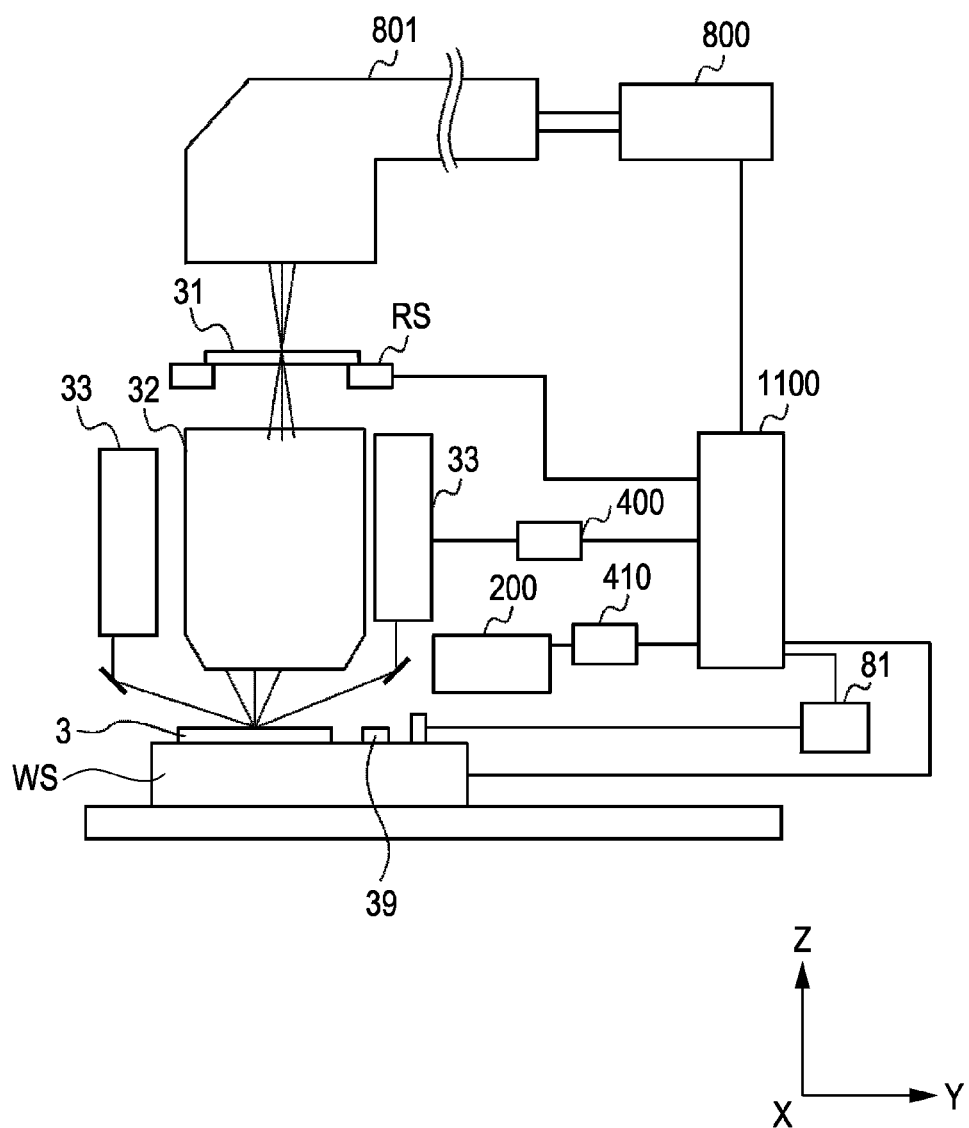
FIG. 13 is a block diagram of a semiconductor exposure apparatus, including the surface shape measuring apparatus, according to a fourth exemplary embodiment of the present invention.

FIG. 13 is a block diagram of a semiconductor exposure apparatus, including the surface shape measuring apparatus, according to a fourth exemplary embodiment of the present invention. As illustrated in FIG. 13, the exposure apparatus includes an illumination apparatus 800, a reticle stage RS on which a reticle 31 is placed, a projection optical system 32, a wafer stage WS on which a wafer 3 is placed, and a reference plate (mask) 39 arranged on the wafer stage WS. Further, the exposure apparatus includes a surface position measuring apparatus 33, a processing unit 400 associated with the measuring apparatus 33, a surface shape measuring apparatus 200, and a processing unit 410 associated with the measuring apparatus 200. The surface shape measuring apparatus 200 can be one of the apparatuses according to the first to third exemplary embodiments. In this fourth exemplary embodiment, the surface position measuring apparatus 33 and the surface shape measuring apparatus 200 are referred to as a focus measuring apparatus 33 and a focus calibrating apparatus 200, respectively, for more clearly expressing their functions. A control unit 1100 includes a CPU and a memory, and it is electrically connected to the illumination apparatus 800, the reticle stage RS, the wafer stage WS, the focus measuring apparatus 33, and the focus calibrating apparatus 200 for controlling the operation of the exposure apparatus. In this fourth exemplary embodiment, the control unit 1100 further executes calculation and control to correct a measured value when the focus measuring apparatus 33 detects the surface position of the wafer 3.

The illumination apparatus 800 illuminates the reticle 31 on which a circuit pattern to be transferred is formed. The illumination apparatus 800 includes a light source unit 800 and an illumination optical system 801. The illumination optical system 801 has the function of uniformly illuminating the reticle 31 and the polarized illumination function.

The light source unit 800 is, for example, a laser. The laser can be, e.g., an ArF excimer laser with a wavelength of about 193 nm or a KrF excimer laser with a wavelength of about 248 nm. The type of the light source is not limited to the excimer laser. More specifically, an F2 laser with a wavelength of about 157 nm and an EUV (Extreme Ultraviolet) light with a wavelength of about 20 nm or shorter can also be used.

The illumination optical system 801 is an optical system arranged to illuminate an illumination target surface by using a light beam emitted from the light source unit 800. In this fourth exemplary embodiment, the light beam is shaped through an exposure slit that has a predetermined shape optimum for exposure, and the shaped light beam is illuminated to the reticle 31. The illumination optical system 801 includes lenses, mirrors, an optical integrator, a stop, etc. For example, a condenser lens, a fly-eye lens, an aperture stop, a condenser lens, a slit, and an imaging optical system are arranged in the illumination optical system 801 in order named.

The reticle 31 is made of quartz, for example, and a circuit pattern to be transferred is formed on the reticle 31. The reticle 31 is supported and driven by the reticle stage RS. Diffracted light emerging from the reticle 31 passes through the projection optical system 32 and is projected onto the wafer 3. The reticle 31 and the wafer 3 are arranged in an optically conjugate relation. The circuit pattern on the reticle 31 is transferred onto the wafer 3 by scanning the reticle 31 and the wafer 3 at a speed ratio corresponding to a desired reduction factor ratio. The exposure apparatus includes a reticle detecting unit (not shown) based on a light oblique-incidence system. The reticle 31 is located at a predetermined position while the position of the reticle 31 is detected by the reticle detecting unit.

The reticle stage RS supports the reticle 31 through a reticle chuck (not shown) and is connected to a moving mechanism (not shown). The moving mechanism is constituted by a linear motor, for example, and drives the reticle stage RS in the X-axis direction, the Y-axis direction, the Z-axis direction, and the direction of rotation about each of those axes, thereby moving the reticle 31.

The projection optical system 32 has the function of imaging the light beam coming from the object plane onto the image plane. In this fourth exemplary embodiment, the projection optical system 32 images diffracted light from the circuit pattern, which is formed on the reticle 31, onto the wafer 3. The projection optical system 32 can be provided, for example, as an optical system including a plurality of lens elements, an optical system (catadioptric system) including a plurality of lens elements and at least one concave mirror, or an optical system including a plurality of lens elements and at least one diffractive optical element, e.g., a kinoform.

The wafer 3 is a processing target and has a photoresist coated on a substrate. In this fourth exemplary embodiment, the wafer 3 is also a detection target of which surface position is detected by the focus measuring apparatus 33 and the focus calibrating apparatus 200. In another exemplary embodiment, the wafer 3 is a liquid crystal substrate or one of other processing targets.

The wafer stage WS supports the wafer 3 through a wafer chuck (not shown). As with the reticle stage RS, the wafer stage WS moves the wafer 3 in the X-axis direction, the Y-axis direction, the Z-axis direction, and the direction of rotation about each of those axes by utilizing linear motors. Further, the position of the reticle stage RS and the position of the wafer stage WS are monitored by a 6-axis laser interferometer 81, for example, and both the stages are driven at a constant speed ratio.

A point of measuring a surface position of the wafer 3 (i.e., a focus) will be described below. In this fourth exemplary embodiment, the wafer surface shape is measured by the focus measuring apparatus 33 while the wafer stage WS is scanned over the entire region of the wafer 3 in the scanning direction (Y-direction). Also, the wafer stage WS is stepped by $\Delta X$ in the direction (X-direction) perpendicular to the scanning direction. Then, by repeating the operation of measuring the wafer surface position in the scanning direction, the shape measurement is performed on the entire surface of the wafer 3. In order to increase the throughput, different surface positions on the wafer 3 can be measured at the same time by using the focus measuring apparatus 33 in plural.

The focus measuring apparatus 33 employs an optical height measuring system. Stated another way, the focus measuring apparatus 33 utilizes a method of introducing a light beam to the wafer surface at a large incident angle and detecting an image shift of reflected light from the wafer surface by a position detector, e.g., a CCD sensor. In particular, light beams are caused to enter a plurality of points to be measured on the wafer, and the light beams reflecting from those points are introduced to individual sensors to calculate a tilt of an exposure target surface based on height measurement information obtained at the plural different positions.

Figure 14:
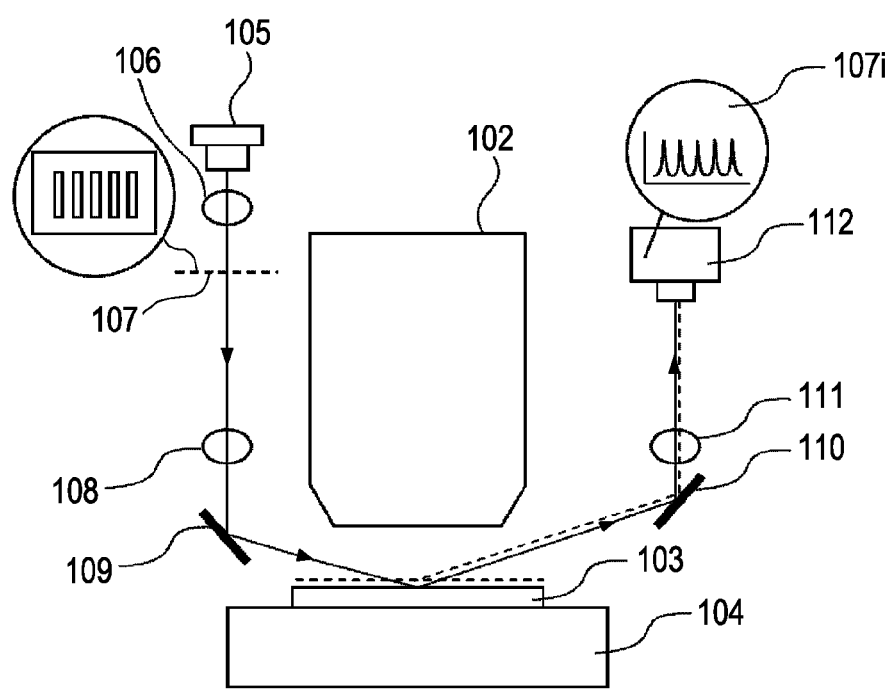
FIG. 14 is a block diagram of a surface position measuring apparatus used in the fourth exemplary embodiment of the present invention.

Details of a focus and tilt detection system will be described below. First, the construction and the operation of the focus measuring apparatus 33 are described. Referring to FIG. 14, the focus measuring apparatus 33 includes a light source 105, a condenser lens 106, a pattern plate 107 having a plurality of rectangular transmission slits arranged side by side, lenses 108 and 111, a wafer 103, a wafer stage (WS) 104, mirrors 109 and 110, and a photodetector 112, such as a CCD sensor. Reference numeral 102 denotes a reduction projection lens to project a reticle (not shown) onto the wafer 103 for exposure. Light emitted from the light source 105 is condensed by the condenser lens 106 and is illuminated to the pattern plate 107. The light having passed through the slits of the pattern plate 107 is illuminated to the wafer 103 at a predetermined angle through the lens 108 and the mirror 109. The pattern plate 107 and the wafer 103 are in an imaging relation with respect to the lens 108, and an aerial image of each slit of the pattern plate 107 is formed on the wafer. Reflected light from the wafer 103 is received by the CCD sensor 112 through the mirror 110 and the lens 111. Slit images of the wafer 103 are reimaged on the CCD sensor 112 by the lens 111, and slit image signals corresponding to the slits of the pattern plate 107 are obtained as indicated by 107i. By detecting position shifts of those signals on the CCD sensor 112, the Z-directional position of the wafer 103 is measured. Assuming the incident angle to be $\theta in$, when the wafer surface is changed by dZ from a position w1 to w2 in the Z-direction, a shift amount m1 of an optical axis on the wafer 3 can be expressed by the following formula:

$$m1 = 2 \cdot dZ \cdot \tan \theta in \quad (1)$$

For example, assuming the incident angle $\theta in$ to be 84 degrees, $m1=19 \cdot dZ$ is resulted. This implies that an amount of displacement is magnified 19 times the displacement of the wafer. An amount of displacement on the photodetector is obtained by multiplying a value of (1) by the magnification of the optical system (i.e., the imaging magnification by the lens 111).

Figure 15:
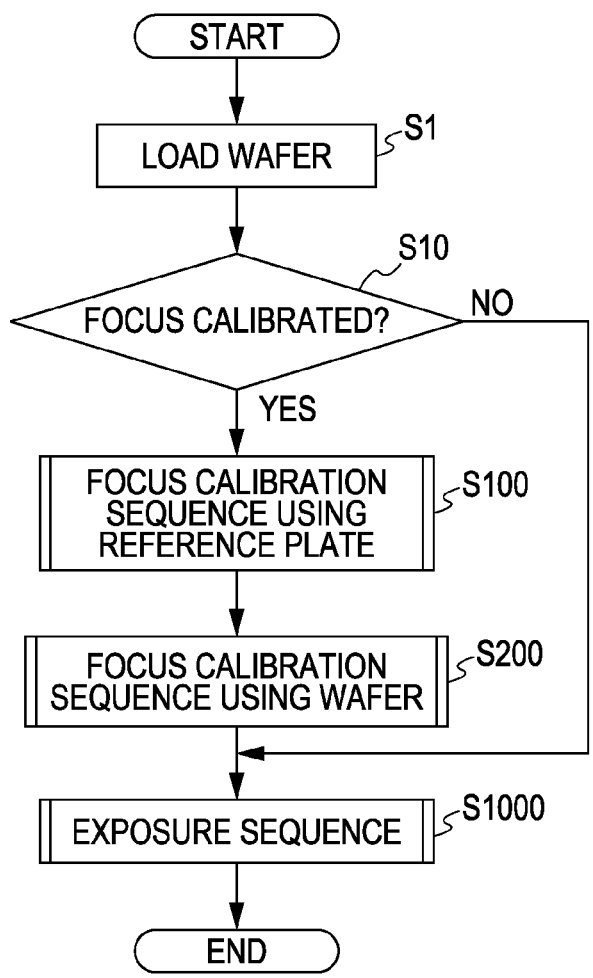
FIG. 15 is a flowchart of an exposure sequence in the fourth exemplary embodiment of the present invention.

An exposure method using the above-described exposure apparatus according to the fourth exemplary embodiment of the present invention will be described in detail below. FIG. 15 is a flowchart of an entire sequence of the exposure method when the exposure apparatus according to the fourth exemplary embodiment of the present invention is used. First, in step S1, the wafer 3 is loaded into the apparatus. Then, whether to execute focus calibration by the focus measuring apparatus 33 or not is determined in step S10. The determination is automatically made on the basis of information, e.g., "whether the relevant wafer is a head wafer in a lot", "whether the relevant wafer is a wafer in a head one of plural lots", and "whether the relevant wafer is a wafer in a process for which focus accuracy is strictly demanded". Such information is previously stored in the exposure apparatus by a user. If the focus calibration is determined to be not necessary in step S10, the process flow advances to step S1000 in which an ordinary exposure sequence is executed on the wafer. On the other hand, if the focus calibration is determined to be necessary in step S10, the process flow advances to a focus calibration sequence in step S100.

Figure 16:
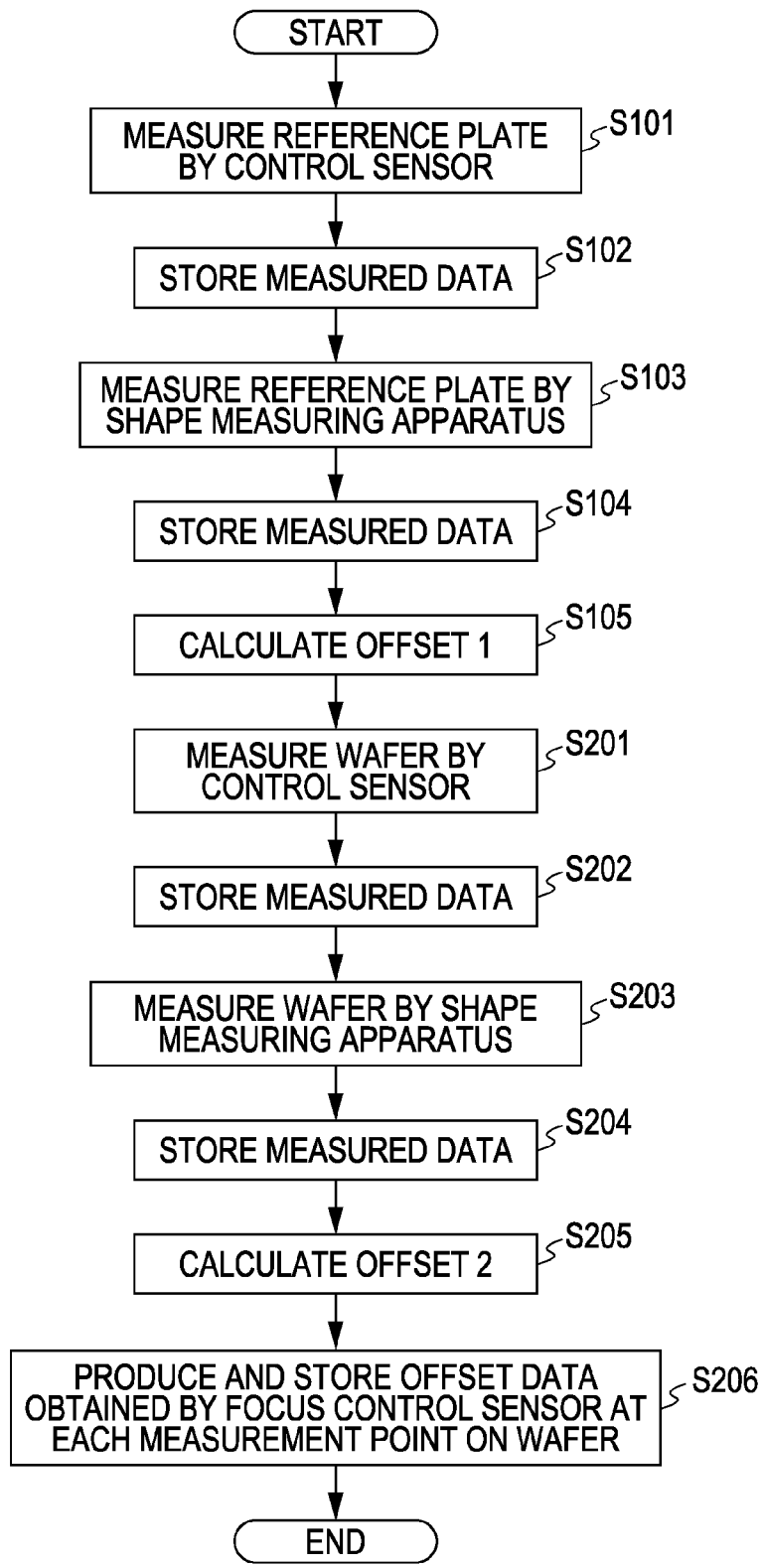
FIG. 16 is a flowchart of a calibration method in the fourth exemplary embodiment of the present invention.
Figure 17:
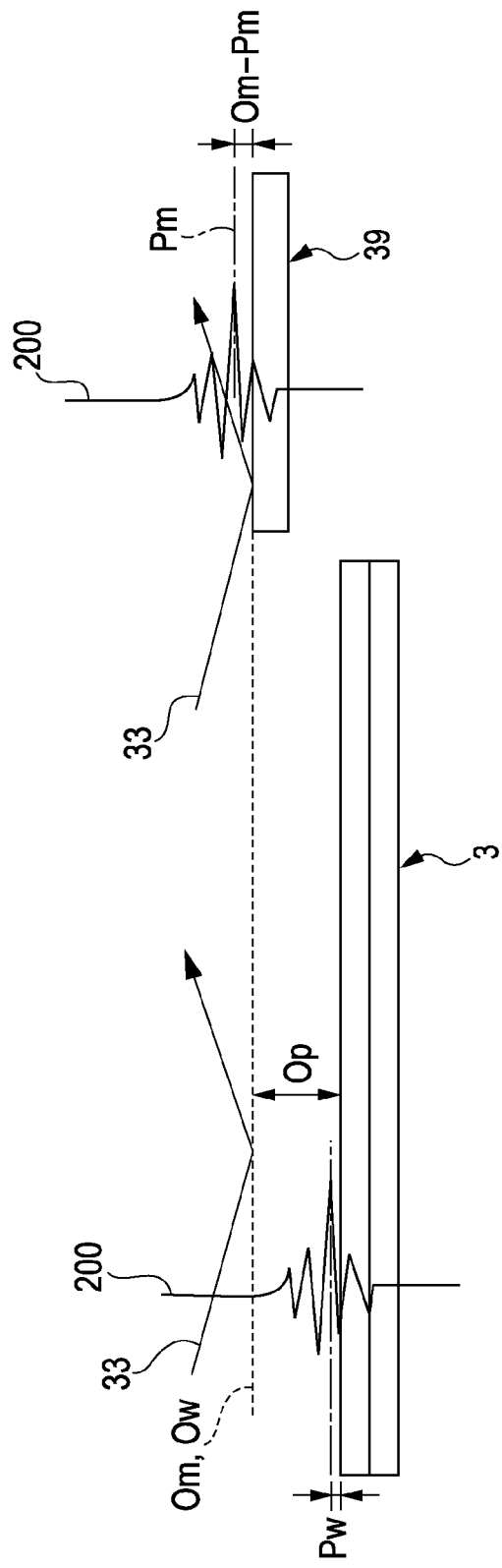
FIG. 17 is an explanatory view illustrating the calibration method in the fourth exemplary embodiment of the present invention.

In step S100, a flowchart illustrated in FIG. 16 is executed. First, the wafer stage WS is driven to properly position the reference plate 39 under the focus measuring apparatus 33. The reference plate 39 is formed of a glass plate having high surface accuracy, i.e., the so-called optical flat. The surface of the reference plate 39 has a region in which reflectance is uniform to prevent generation of measurement errors caused by the focus measuring apparatus 33. The measurement is performed on that region. The reference plate 39 can also be provided as part of a plate including various calibration marks needed in other calibrations (e.g., for an alignment detection system and evaluation of the projection optical system), which are executed in the exposure apparatus. The Z-directional position of the reference plate 39 is detected by the focus measuring apparatus 33 in step S101, and a measured value Om is stored in the apparatus in step S102. Then, in step S103, the wafer stage WS is driven to properly position the reference plate 39 under the focus calibrating apparatus 200, and shape measurement is executed by the focus calibrating apparatus 200 at the same place in the XY-plane on the reference plate 39 as the region measured by the focus measuring apparatus 33. In step S104, shape measurement data Pm is stored in the apparatus. In step S105, a first offset 1 is calculated. As illustrated in FIG. 17, the offset 1 is obtained as the difference between the measured value Pm of the focus calibrating apparatus 200 and the measured value Om of the focus measuring apparatus 33. The offset 1 is free from the measurement errors of the focus measuring apparatus 33 because the measurement is executed on the optically uniform surface of the reference plate 39. Accordingly, the offset 1 should be zero in an ideal condition. However, the offset 1 is generated due to, e.g., a system offset in the scanning direction of the wafer stage WS and a long-term drift of the focus measuring apparatus 33 or the focus calibrating apparatus 200. For that reason, the offset 1 is desirably measured on the periodical basis.

The focus calibration sequence S100 using the reference plate 39 is completed through the above-described steps. Following the focus calibrating sequence S100, the focus calibrating sequence S200 using the wafer 3 is executed. In step S201 of FIG. 16, the wafer stage WS is driven to properly position the wafer 3 at the measurement position of the focus measuring apparatus 33. A (wafer-surface) measurement position Wp on the wafer 3 is assumed to be in match with the measurement position in the later-described exposure sequence. Further, the Z-directional position is detected at the measurement position Wp on the wafer 3 by the focus measuring apparatus 33 in step S201, and a measured value Ow is stored in the apparatus in step S202. In step S203, the wafer stage WS is driven to properly position the wafer 3 under the focus calibrating apparatus 200, and the shape measurement is executed at the measurement position Wp on the wafer 3 by the focus calibrating apparatus 200. In step S204, shape measurement data Pw is stored in the apparatus. The measurement position Wp on the wafer 3 can be selected from various modes including, e.g., one point per wafer, one point per shot, all points in a shot, all points in plural shots, and all points in a wafer.

In step S205, a second offset 2 is calculated. As illustrated in FIG. 17, the offset 2 is calculated as the difference between the measured value Pw of the focus calibrating apparatus 200 and the measure value Ow of the focus measuring apparatus 33 for each measurement position Wp on the wafer 3.

In step S206, the difference between the offset 2 and the offset 1 is calculated per measurement point on the wafer 3 and is stored in the apparatus. An offset amount Op at each measurement point on the wafer 3 can be obtained by the following formula (2);

$$Op(i)=[Ow(i)-Pw(i)]-(Om-Pm) \quad (2)$$

where i denotes the point number representing the measurement position on the wafer 3. The focus calibration sequence S200 using the wafer 3 is thus completed.

Figure 18:
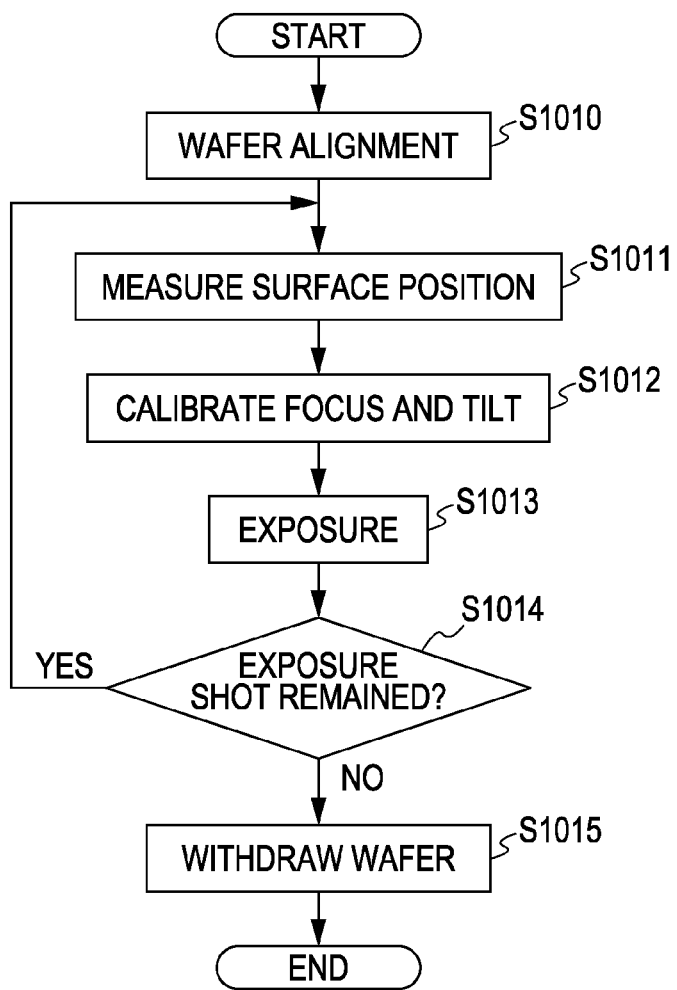
FIG. 18 is a flowchart of an exposure method in the fourth exemplary embodiment of the present invention.
Figure 19:
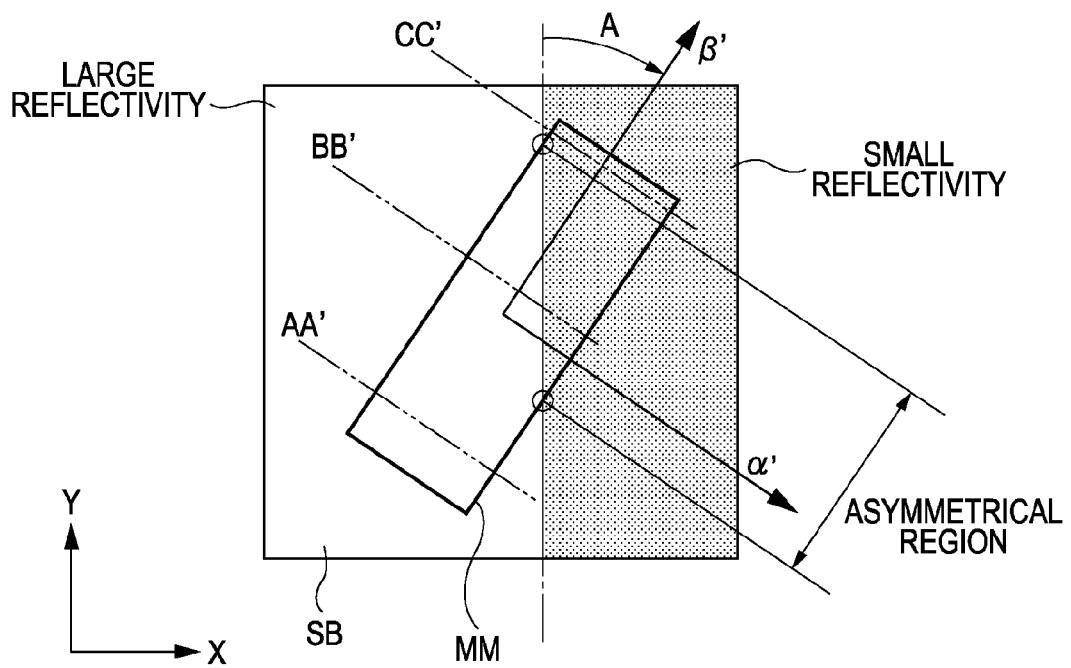
FIG. 19 is an illustration to explain the problem with a known surface position measuring apparatus.
Figure 20:
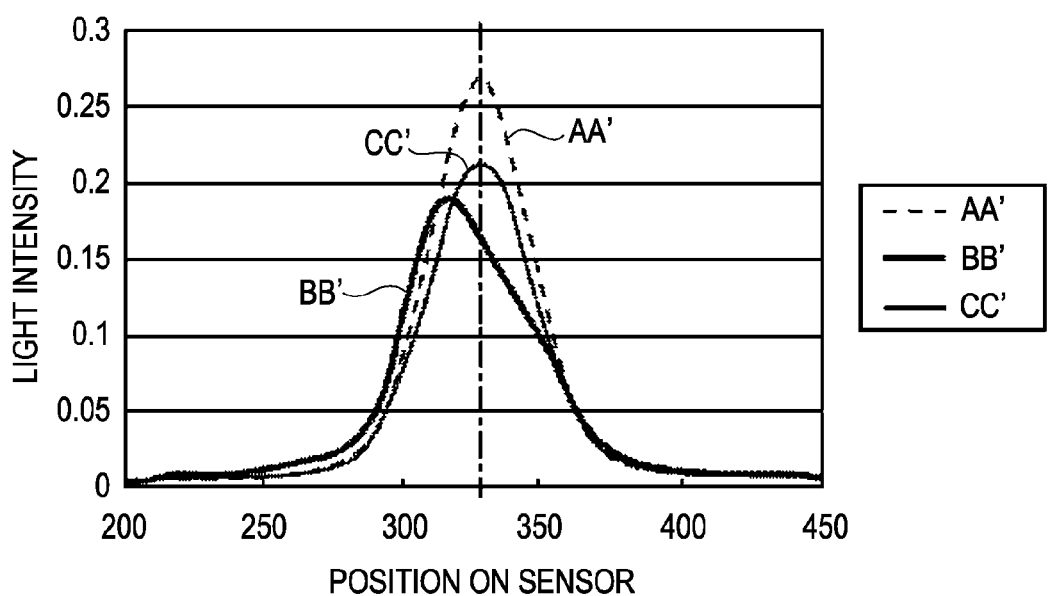
FIG. 20 is a graph illustrating an example of a signal file measured in the known surface position measuring apparatus of FIG. 19.
Figure 21:
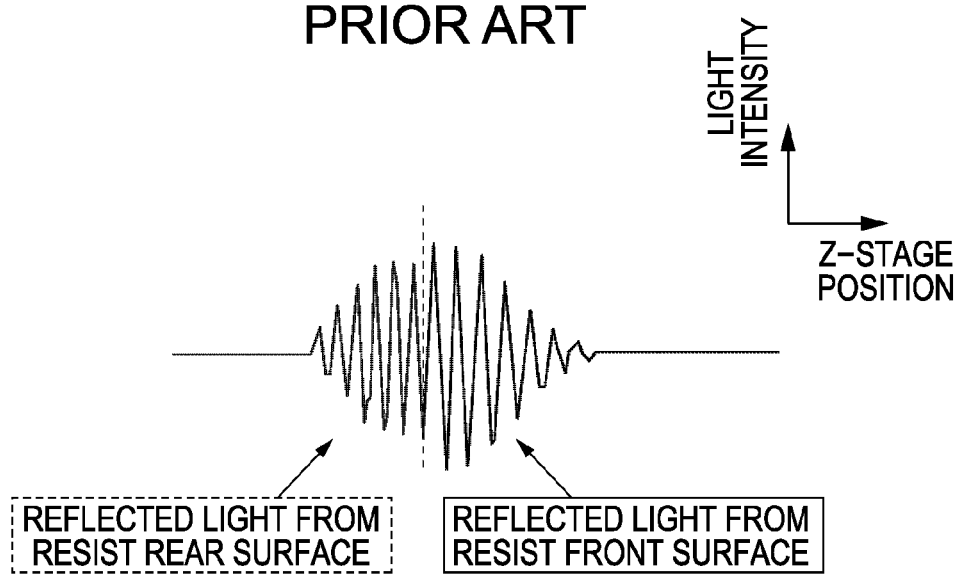
FIG. 21 is an illustration to explain the problem with a known surface shape measuring apparatus.
Figure 22:
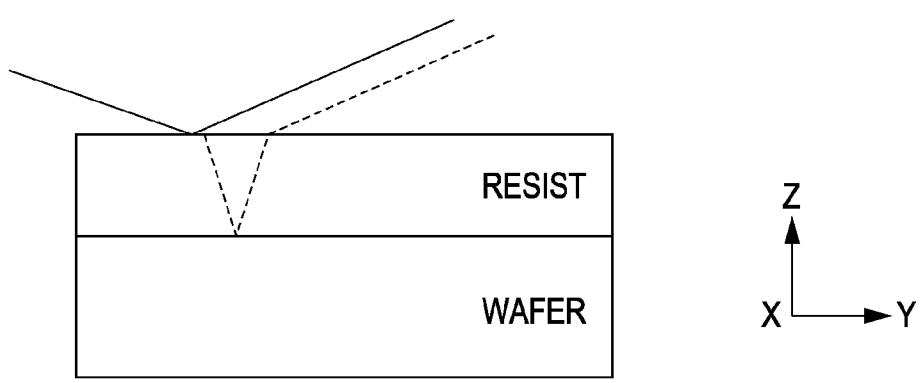
FIG. 22 is an illustration to explain the problem with the known surface shape measuring apparatus.
Figure 23:
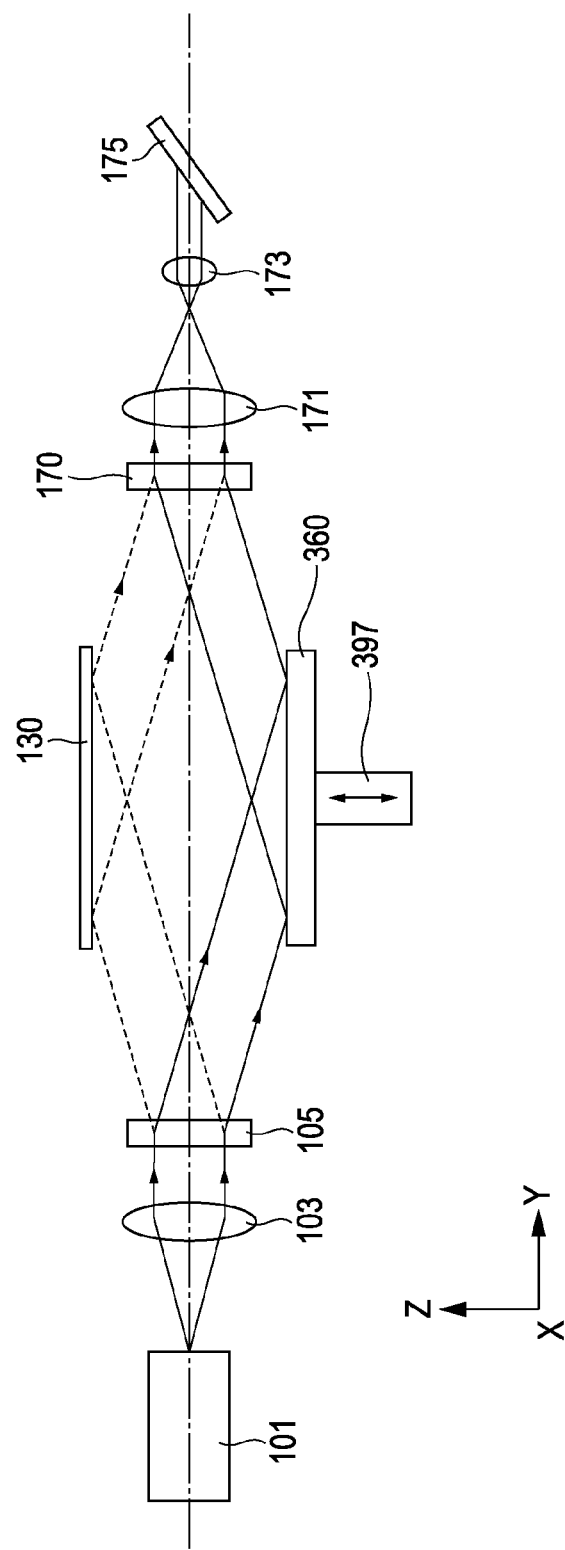
FIG. 23 is a block diagram of the known surface shape measuring apparatus.

The exposure sequence S1000 executed after the completion of both the focus calibration sequences S100 and S200 will be described below. FIG. 18 is a flowchart illustrating details of the exposure sequence S1000. Referring to FIG. 18, wafer alignment is executed in step S1010. The wafer alignment is executed by detecting a mark position on the wafer by an alignment scope (not shown) and aligning the wafer in the XY-plane with respect to the exposure apparatus. In step S1011, a surface position at a predetermined location on the wafer 3 is measured by the focus measuring apparatus 33. The predetermined location includes the point measured by the calibration sequence using the wafer 3. Thus, the shape of the entire wafer surface is measured by correcting each measured value based on the offset amount Op(i) that has been calculated in accordance with the formula (2). Wafer surface shape data after the correction is stored in the exposure apparatus. In step S1012, the wafer 3 is moved by the wafer stage WS from the position under the focus measuring apparatus 33 to an exposure position under the projection lens 102 for a first exposure shot. Simultaneously, the processing unit associated with the exposure apparatus prepares surface shape data for the first exposure shot based on the surface shape data of the wafer 3, and calculates a shift amount from the exposure image plane. Then, the wafer stage is driven in the Z-direction and the tilt direction in accordance with the calculated shift amount from the exposure image plane to perform the operation for matching with the wafer surface shape in the height direction substantially in units of exposure slit. In step S1013, the exposure and scanning of the wafer stage WS in the Y-direction are performed. After the first exposure shot is completed in such a manner, it is determined in step S1014 whether a not-yet-executed exposure shot remains. If the not-yet-executed exposure shot remains, the process flow returns to step S1012. Thereafter, as in the first exposure shot, surface shape data for the next exposure shot is prepared and the exposure is performed while the wafer stage is driven in the Z-direction and the tilt direction to perform the operation for matching with the wafer surface shape in the height direction substantially in units of exposure slit. In step S1014, it is determined again whether an exposure shot to be executed (i.e., a not-yet-executed exposure shot) remains. Then, the above-described operation is repeated until the not-yet-executed exposure shot remains no more. After all the exposure shots are completed, the wafer 3 is withdrawn out of the apparatus in step S1015 and the exposure sequence is brought to an end.

In this fourth exemplary embodiment, immediately before the exposure for each shot, the surface shape data for the relevant exposure shot is prepared and the shift amount from the exposure image plane is calculated to determine an amount by which the wafer stage is to be driven. However, the timings of the individual steps can be modified such that, before the exposure of the first shot, the surface shape data is prepared for all the exposure shots and the shift amount from the exposure image plane is calculated to determine an amount by which the wafer stage is to be driven.

Further, the wafer stage WS is not limited to a single stage. For example, it can also be constituted as the so-called twin-stage including two stages, i.e., an exposure stage used in the exposure and a measurement stage used to perform wafer alignment and to measure the surface shape. In the latter case, the focus measuring apparatus 33 and the focus calibrating apparatus 200 are mounted on the measurement stage.

A method of adjusting the light polarization state in the surface shape measuring apparatus (focus calibrating apparatus) 200 when the surface shape measuring apparatus 200 is installed in the exposure apparatus, as in this fourth exemplary embodiment, will be described below. While the light polarization state can be adjusted by using a substrate coated with a thick resist of several microns as described above in the second exemplary embodiment, the following description is made of an exemplary embodiment in which the adjusting method is performed on the basis of the polarization of exposure light used in the exposure apparatus. The illumination optical system 801 of the exposure apparatus usually includes a polarized illumination unit to specify the polarization state of light illuminated to the reticle. Therefore, when the exposure apparatus is delivered, the light polarization state in the surface shape measuring apparatus 200 is adjusted on the basis of the polarization of the exposure light. More specifically, first, linearly polarized light in a predetermined state (e.g., p-polarized light) is formed by using the polarized illumination unit in the illumination optical system 801 for the exposure light. Then, the exposure light in the predetermined linear polarization state is caused to perpendicularly enter a polarizer including a rotation drive unit. Further, the polarizer is rotated to determine the position where transmittance is maximized or minimized. This results in the polarization state corresponding to the p- or s-polarized light used as the exposure light. Thereafter, that polarizer is mounted such that the light from the light source in the focus calibrating apparatus 200 perpendicularly enters the polarizer. When such an adjusting method is applied to the surface shape measuring apparatus according to the second exemplary embodiment illustrated in FIG. 8, the adjustment is completed by rotating the polarizer through 45 degrees with the rotation drive unit. Thus, the adjustment of the polarization state can be performed by using the exposure apparatus without preparing a particular substrate.

After adjusting the polarization state in the surface shape measuring apparatus on the basis of the polarization of the exposure light when the exposure apparatus is delivered, the polarization state can be finely adjusted by preparing a substrate having a thick resist and employing the rotation drive unit depending on the wafer structure to be processed.

Because complicated circuit patterns, scribe lines, etc. are present on a wafer, i.e., a substrate to be measured and processed by a semiconductor exposure apparatus, a reflectance distribution, a local tilt, etc. are generated at a relatively high probability. Therefore, the present invention is very effective in reducing measurement errors caused by the reflectance distribution, the local tilt, etc. More accurate measurement of the wafer surface position improves accuracy focus alignment of the optimum exposure surface and the wafer surface, thus enhancing the performance of a semiconductor device and increasing production yields.

A device (such as a semiconductor integrated circuit device or a liquid crystal display device) may be manufactured, for example, through a step of exposing a substrate (such as a wafer or a glass plate), which is coated with a photoresist, by using the exposure apparatus according to one of the above-described exemplary embodiments, a step of developing the exposed substrate, and other steps known in the art.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-048176, filed Feb. 28, 2008, which is hereby incorporated by reference herein in its entirety.

What is claimed is:

1. A surface shape measuring apparatus configured to measure a surface shape of a film formed on a substrate, the apparatus including:
   an illumination system arranged to split wide-band light from a light source into measurement light and reference light, the measurement light being illuminated to obliquely enter a surface on the substrate, the reference light being illuminated to obliquely enter a reference mirror;
   a light receiving system arranged to combine the measurement light reflected by the surface on the substrate and the reference light reflected by the reference mirror with each other and to introduce the combined light to a photoelectric conversion element; and
   a processing unit configured to calculate the surface shape of the film based on an interference signal detected by the photoelectric conversion element,
   wherein an incident angle of the measurement light upon the surface of the film and an incident angle of the reference light upon the reference mirror are each larger than the Brewster's angle,
   wherein the illumination system includes a first polarizer allowing passage of linearly polarized light in a predetermined direction, which is included in the wide-band light from the light source,
   wherein the light receiving system includes a second polarizer allowing passage of linearly polarized light in the predetermined direction, which is included in the measurement light reflected by the surface of the film and the reference light reflected by the reference mirror,
   wherein the linearly polarized light in the predetermined direction having passed the first polarizer enters the surface on the substrate as the measurement light and the reference mirror as the reference light,
   wherein the linearly polarized light in the predetermined direction having passed the first polarizer includes an s-polarized light component and a p-polarized light component in entering the surface on the substrate and in entering the reference mirror,
   wherein a polarization direction of linearly polarized light reflected by an interface between the film and the substrate is different from the predetermined direction, and
   wherein the linearly polarized light reflected by an interface between the film and the substrate is removed by the second polarizer.

2. The surface shape measuring apparatus according to claim 1, wherein a direction of the linearly polarized light which enters each of the surface on the substrate as the measurement light and the reference mirror as the reference light is a direction of +45° to an incident plane in entering each of the surface on the substrate and the reference mirror or a direction of −45° to the incident plane.

3. An exposure apparatus configured to expose a substrate through a pattern on an original, the exposure apparatus including a surface shape measuring apparatus according to claim 1,
   wherein the surface shape measuring apparatus is configured to measure a surface shape of a film formed on the substrate.

4. A device manufacturing method including:
   exposing a substrate by using the exposure apparatus of claim 3; and
   developing the exposed substrate.

5. A surface shape measuring apparatus configured to measure a surface shape of a film formed on a substrate, the apparatus including:
   an illumination system arranged to split wide-band light from a light source into measurement light and reference light, the measurement light being illuminated to obliquely enter a surface on the substrate, the reference light being illuminated to obliquely enter a reference mirror;
   a light receiving system arranged to combine the measurement light reflected by the surface on the substrate and the reference light reflected by the reference mirror with each other and to introduce the combined light to a photoelectric conversion element; and
   a processing unit configured to calculate the surface shape of the film based on an interference signal detected by the photoelectric conversion element,
   wherein an incident angle of the measurement light upon the surface of the film and an incident angle of the reference light upon the reference mirror are each larger than the Brewster's angle, wherein the illumination system includes a first polarizer allowing passage of linearly polarized light in a predetermined direction, which is included in the wide-band light from the light source, and a first wavelength plate converting the linearly polarized light having passed through the first polarizer into circular polarized light, wherein the light receiving system includes a second wavelength plate converting the circular polarized light of the measurement light reflected by the surface of the film, light reflected by an interface between the film and the substrate, and the reference light reflected by the reference mirror into linearly polarized light, and wherein the circular polarized light from first wavelength plate enters the surface on the substrate as the measurement light and the reference mirror as the reference light, wherein a polarization direction of linearly polarized light from the second wavelength plate, which is light reflected by an interface between the film and the substrate is different from a polarization direction of linearly polarized reference light from the second wavelength plate.

6. The surface shape measuring apparatus according to claim 5, wherein the light receiving system includes a second polarizer allowing passage of the linearly polarized light in the predetermined direction, which is included in light having passed through the second wavelength plate, wherein linearly polarized light from the second wavelength plate, which is light reflected by an interface between the film and the substrate is removed by the second polarizer.

7. The surface shape measuring apparatus according to claim 5, wherein the first wavelength plate is a $\lambda/4$-plate.

8. An exposure apparatus configured to expose a substrate through a pattern on an original, the exposure apparatus including a surface shape measuring apparatus according to claim 5, wherein the surface shape measuring apparatus is configured to measure a surface shape of a film formed on the substrate.

9. A device manufacturing method including:

exposing a substrate by using the exposure apparatus of claim 8; and developing the exposed substrate.

* * * * *